United States Patent
Lee et al.

(10) Patent No.: US 10,256,190 B2
(45) Date of Patent: Apr. 9, 2019

(54) VARIABLE RESISTANCE MEMORY DEVICES

(71) Applicants: Yongkyu Lee, Gwacheon-si (KR); Gwanhyeob Koh, Seoul (KR); Boyoung Seo, Suwon-si (KR)

(72) Inventors: Yongkyu Lee, Gwacheon-si (KR); Gwanhyeob Koh, Seoul (KR); Boyoung Seo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/809,373

(22) Filed: Nov. 10, 2017

(65) Prior Publication Data

US 2018/0211910 A1    Jul. 26, 2018

(30) Foreign Application Priority Data

Jan. 20, 2017 (KR) .................. 10-2017-0009970

(51) Int. Cl.

| | | |
|---|---|---|
| *H01L 23/528* | (2006.01) | |
| *H01L 43/08* | (2006.01) | |
| *H01L 27/22* | (2006.01) | |
| *H01L 45/00* | (2006.01) | |
| *H01L 27/24* | (2006.01) | |

(52) U.S. Cl.
CPC .......... *H01L 23/528* (2013.01); *H01L 27/222* (2013.01); *H01L 43/08* (2013.01); *H01L 27/2481* (2013.01); *H01L 45/06* (2013.01); *H01L 45/08* (2013.01)

(58) Field of Classification Search
CPC ... H01L 27/222; H01L 27/224; H01L 27/226; H01L 27/2481; H01L 45/1233; H01L 43/02; H01L 43/08
See application file for complete search history.

(56) References Cited

U.S. PATENT DOCUMENTS

| | | | |
|---|---|---|---|
| 6,445,612 B1 | 9/2002 | Naji | |
| 6,462,980 B2 | 10/2002 | Schuster-Woldan et al. | |
| 6,570,783 B1 | 5/2003 | Deak | |
| 6,660,568 B1 | 12/2003 | Gaidis | |
| 6,687,148 B2 | 2/2004 | Shau | |
| 6,743,642 B2 | 6/2004 | Costrini et al. | |
| 6,795,334 B2 | 9/2004 | Iwata et al. | |
| 6,897,101 B2 | 5/2005 | Weitz | |
| 6,909,129 B2 | 6/2005 | Kim et al. | |
| 7,037,762 B2 * | 5/2006 | Joo | H01L 27/2436 257/209 |
| 7,095,650 B2 | 8/2006 | Motoyoshi | |
| 7,266,034 B2 | 9/2007 | Hirai et al. | |
| 7,321,508 B2 | 1/2008 | Motoyoshi | |
| 7,558,100 B2 * | 7/2009 | Ahn | G11C 11/5678 365/148 |

(Continued)

FOREIGN PATENT DOCUMENTS

KR    2004-0059060 A    7/2004

*Primary Examiner* — Allison Bernstein
(74) *Attorney, Agent, or Firm* — Harness, Dickey & Pierce, P.L.C.

(57) ABSTRACT

A variable resistance memory device includes different variable resistance patterns on different memory regions of a substrate. The different variable resistance patterns may be at different heights from the substrate and may have different intrinsic properties. The different variable resistance patterns may at least partially comprise separate memory cells that are each configured to function as a non-volatile memory cell or a random access memory cell, respectively.

12 Claims, 21 Drawing Sheets

(56) References Cited

U.S. PATENT DOCUMENTS

| | | |
|---|---|---|
| 7,723,786 B2 | 5/2010 | Kakoschke et al. |
| 7,965,542 B2 * | 6/2011 | Asao .................. G11C 11/16 |
| | | 365/148 |
| 8,067,808 B2 | 11/2011 | Kakoschke et al. |
| 8,492,808 B2 | 7/2013 | Omori et al. |
| 8,535,952 B2 | 9/2013 | Ranjan et al. |
| 8,750,032 B2 | 6/2014 | Kawahara et al. |
| 8,786,040 B2 * | 7/2014 | Doyle .................. H01L 43/08 |
| | | 257/295 |
| 8,896,096 B2 | 11/2014 | Tu et al. |
| 8,901,685 B2 | 12/2014 | Ingvarsson et al. |
| 8,917,531 B2 | 12/2014 | Annunziata et al. |
| 8,980,649 B2 | 3/2015 | Ranjan et al. |
| 9,065,035 B2 | 6/2015 | Annunziata et al. |
| 9,224,784 B2 * | 12/2015 | Kim .................... H01L 27/222 |
| 9,275,746 B2 | 3/2016 | Jeon et al. |
| 9,330,754 B2 | 5/2016 | Moon |
| 9,373,663 B2 | 6/2016 | Satoh et al. |
| 9,552,859 B2 | 1/2017 | Roy et al. |
| 9,614,007 B2 * | 4/2017 | Boniardi ............. H01L 27/2481 |
| 9,893,278 B1 * | 2/2018 | Chuang ................ H01L 27/222 |
| 2005/0036363 A1 | 2/2005 | Shau |
| 2008/0273364 A1 | 11/2008 | Chao |
| 2009/0193184 A1 | 7/2009 | Yu et al. |
| 2010/0019297 A1 * | 1/2010 | Hwang ................ H01L 27/228 |
| | | 257/295 |
| 2012/0134200 A1 * | 5/2012 | Khoueir ............. G11C 11/5607 |
| | | 365/158 |
| 2015/0014801 A1 | 1/2015 | Satoh et al. |
| 2015/0249096 A1 | 9/2015 | Lupino et al. |
| 2016/0276406 A1 | 9/2016 | Satoh et al. |

\* cited by examiner

| | Rs0 | Rs1 | Rs2 | Rs3 |
|---|---|---|---|---|
| VR3 | ↑↑ | ↑↑ | ↑↑ | ↑↓ |
| VR2 | ↑↑ | ↑↑ | ↑↓ | ↑↓ |
| VR1 | ↑↑ | ↑↓ | ↑↓ | ↑↓ |

VARIABLE RESISTANCE MEMORY DEVICES

CROSS-REFERENCE TO RELATED APPLICATIONS

This U.S. non-provisional patent application claims priority under 35 U.S.C. § 119 to Korean Patent Application No. 10-2017-0009970, filed on Jan. 20, 2017, in the Korean Intellectual Property Office, the entire contents of which are hereby incorporated by reference.

BACKGROUND

The present disclosure relates to semiconductor devices, and in particular, to variable resistance memory devices.

In order to meet an increasing demand for semiconductor memory devices with high performance and low power consumption properties, various next-generation semiconductor memory devices (e.g., ferroelectric random access memory (FRAM), magnetic RAM (MRAM), phase-change RAM (PRAM), resistive RAM (RRAM), and so forth) are being developed. Next-generation semiconductor memory devices may include, as a memory element, a material or structure having a resistance ("electrical resistance") that may be changed by a current or voltage applied thereto and can be maintained even when a current or voltage supply is interrupted.

In particular, MRAM devices can provide technical advantages, such as low latency and/or non-volatility, and thus, they are emerging as next-generation semiconductor memory devices. MRAM devices may include a magnetic tunnel junction (MTJ) pattern. The MTJ pattern includes two magnetic layers and an insulating layer interposed therebetween. Resistance of the MTJ pattern varies depending on magnetization directions of the magnetic layers. For example, the resistance of the MTJ pattern is greater when the magnetic layers have anti-parallel magnetization directions than when they have parallel magnetization directions. Such a difference in resistance can be used for a data-storing operation in the MRAM device.

SUMMARY

Some example embodiments of the inventive concepts provide a variable resistance memory device, in which variable resistance patterns with different switching characteristics are provided, and a method of fabricating the same.

Some example embodiments of the inventive concepts provide a variable resistance memory device, in which memory cells having different resistance levels are provided, and a method of fabricating the same.

According to some example embodiments, a device may include a substrate including a first memory region and a second memory region, a first variable resistance pattern on the first memory region at a first height from the substrate, and a second variable resistance pattern provided on the second memory region at a second height from the substrate. The second height may be less than the first height from the substrate. The first variable resistance pattern may include a first shape, a first thickness, and a first material. The second variable resistance pattern may include at least one of a second shape that is different from the first shape, a second thickness that is different from the first thickness, and a second material that is different from the first material.

According to some example embodiments, a device may include a plurality of variable resistance patterns vertically stacked on a substrate and connected in series to each other, a selection element connected to a lowermost variable resistance pattern of the plurality of variable resistance patterns, and an interconnection pattern connected to an uppermost variable resistance pattern of the plurality of variable resistance patterns. Each variable resistance pattern of the plurality of variable resistance patterns may be configured to be controlled based on a voltage applied through the interconnection pattern.

According to some example embodiments, a device may include a substrate including a first memory region and a second memory region, a first variable resistance pattern on the first memory region at a first height from the substrate, and a second variable resistance pattern provided on the second memory region at a second height from the substrate, the second height different from than the first height. The second variable resistance pattern may include at least one intrinsic property that is different from a corresponding at least one intrinsic property of the first variable resistance pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiments, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
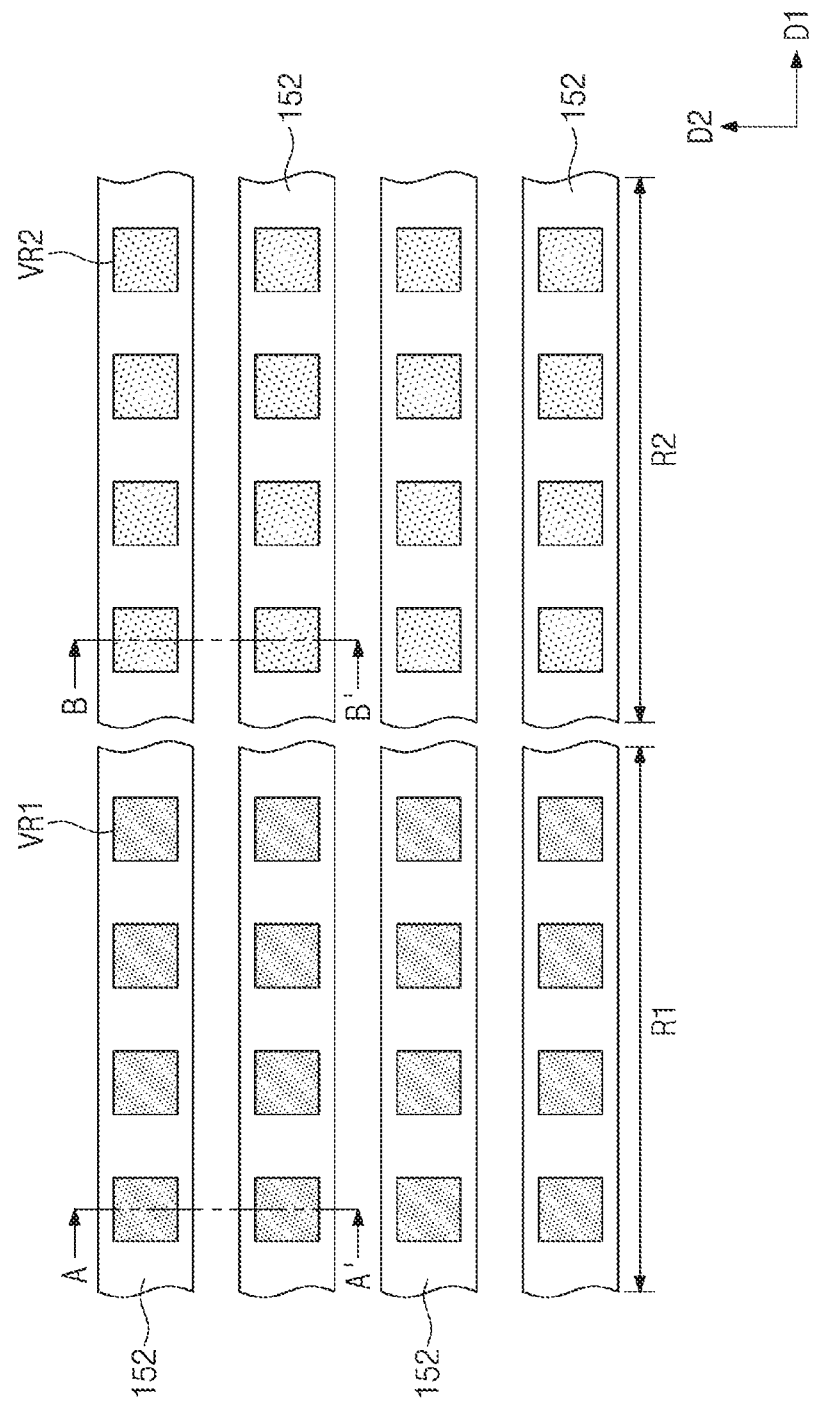
FIG. 1 is a plan view of a variable resistance memory device, according to some example embodiments of the inventive concepts.
Figure 2:
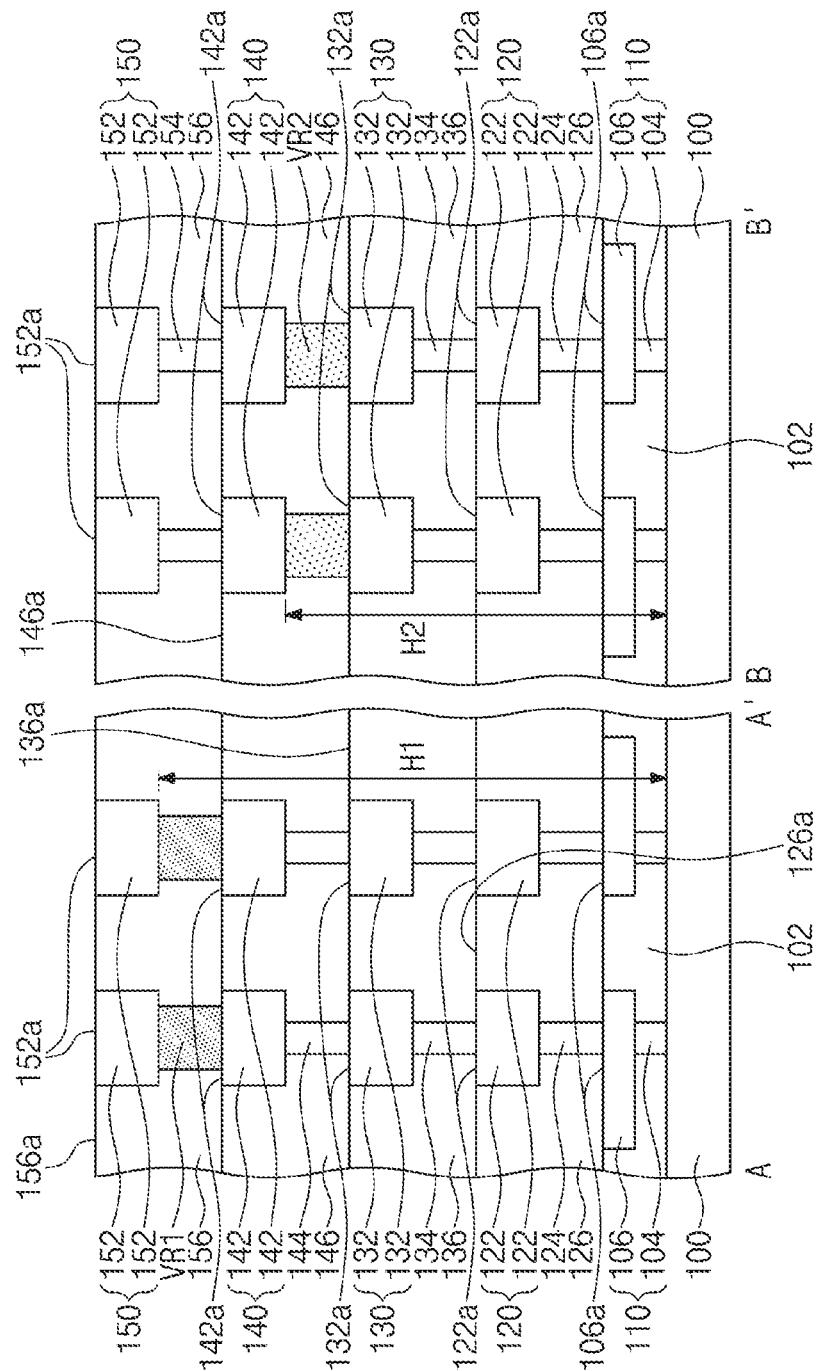
FIG. 2 is a sectional view taken along lines A-A' and B-B' of FIG. 1.
Figure 3A:
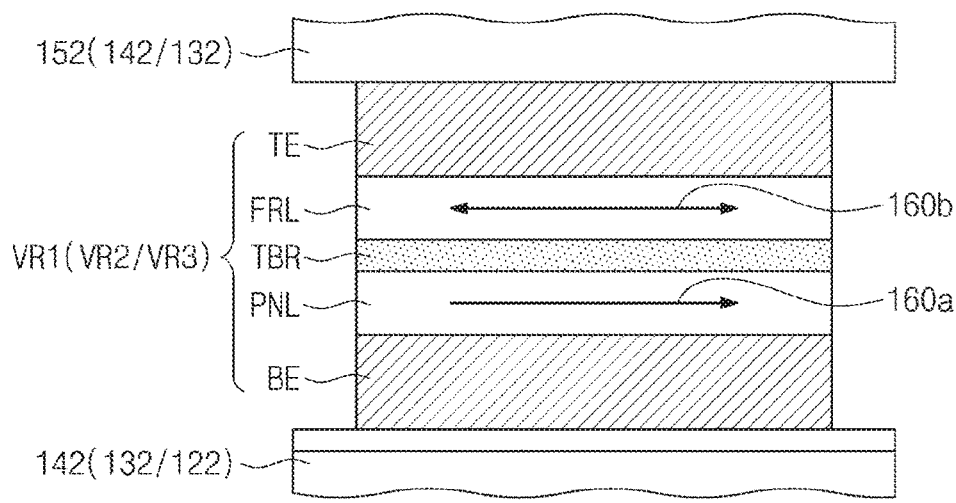
FIG. 3A is a sectional view illustrating an example of a variable resistance pattern according to some example embodiments of the inventive concepts.
Figure 3B:
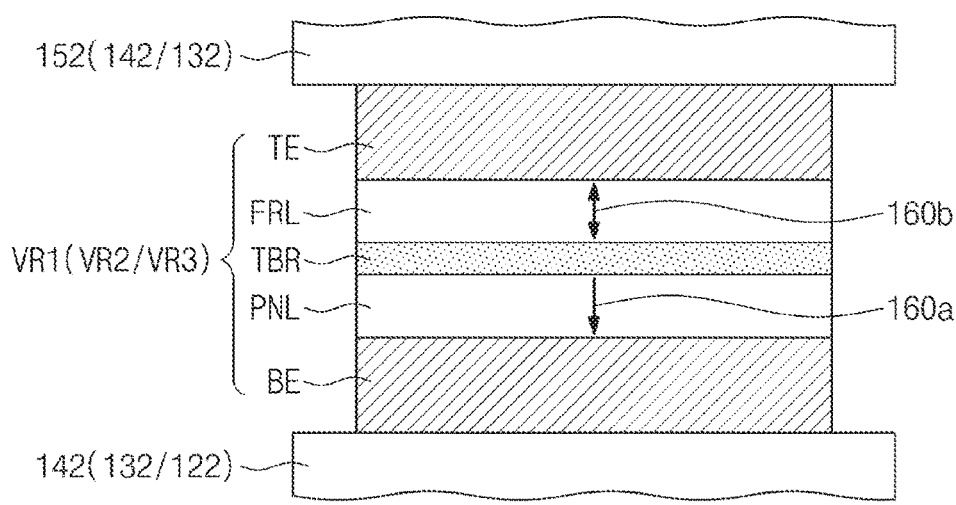
FIG. 3B is a sectional view illustrating another example of a variable resistance pattern according to some example embodiments of the inventive concepts.
Figure 4A:
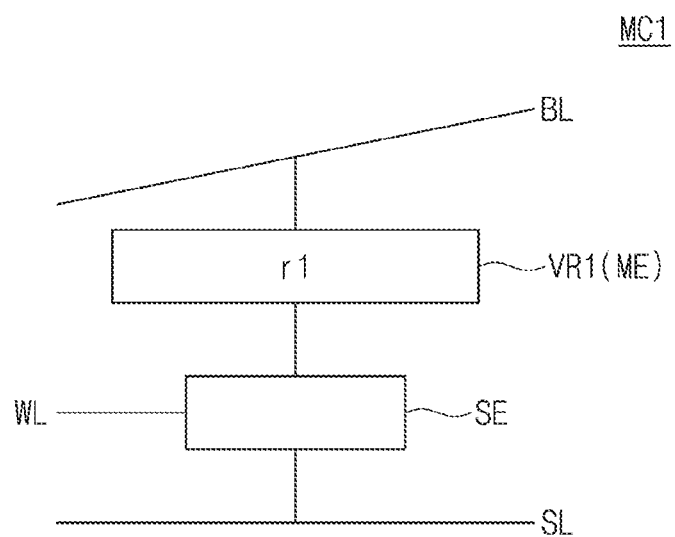
FIG. 4A and FIG. 4B are circuit diagrams illustrating unit memory cells, which are respectively provided in first and second memory regions of a variable resistance memory device according to some example embodiments of the inventive concepts.
Figure 4B:
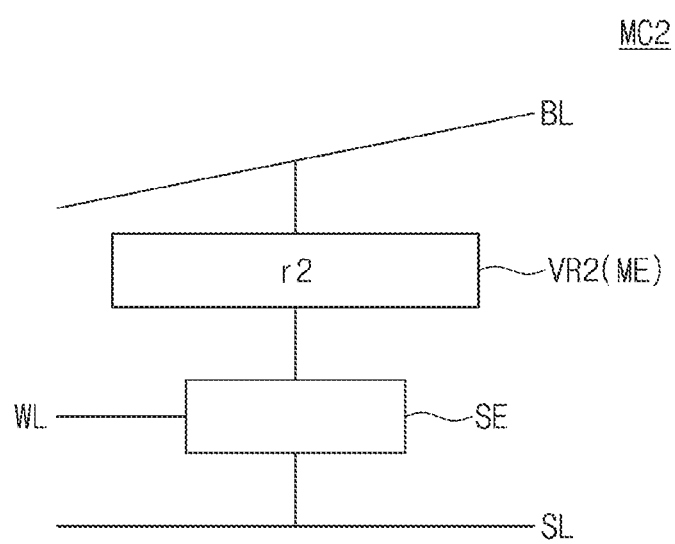

FIG. 1 is a plan view of a variable resistance memory device, according to some example embodiments of the inventive concepts, and FIG. 2 is a sectional view taken along lines A-A' and B-B' of FIG. 1. FIG. 3A is a sectional view illustrating an example of a variable resistance pattern according to some example embodiments of the inventive concepts, and FIG. 3B is a sectional view illustrating another example of a variable resistance pattern according to some example embodiments of the inventive concepts. FIG. 4A and FIG. 4B are circuit diagrams illustrating unit memory cells, which are respectively provided in first and second memory regions of a variable resistance memory device according to some example embodiments of the inventive concepts.

Referring to FIGS. 1 and 2, a substrate 100 including a first memory region R1 and a second memory region R2 may be provided. In the substrate 100, the first and second memory regions R1 and R2 may be different regions that are spaced apart from each other. The first memory region R1 may be a region of the substrate 100, on which memory cells are provided, and the second memory region R2 may be another region of the substrate 100, on which additional memory cells are provided. The substrate 100 may be a semiconductor substrate, such as silicon, silicon-on-insulator (SOI), silicon germanium (SiGe), germanium (Ge), and gallium arsenide (GaAs) wafers.

A lower interlayered insulating layer 102 may be provided on the substrate 100. The lower interlayered insulating layer 102 may cover selection elements provided on the substrate 100. The selection elements may be field effect transistors or diodes. The lower interlayered insulating layer 102 may be formed of or include oxide, nitride, and/or oxynitride. An interconnection structure 110 may be provided in the lower interlayered insulating layer 102. The interconnection structure 110 may include interconnection lines 106, which are spaced apart from the substrate 100, and contacts 104, which are connected to the interconnection lines 106. The interconnection lines 106 may be electrically connected to the substrate 100 via the contacts 104. The interconnection lines 106 and the contacts 104 may be formed of or include a metallic material. As an example, the interconnection lines 106 and the contacts 104 may be formed of or include copper (Cu). In some example embodiments, the interconnection lines 106 may have top surfaces that are substantially coplanar (e.g., coplanar within manufacturing tolerances and/or material tolerances) with that of the lower interlayered insulating layer 102.

A first interlayered insulating layer 156, a second interlayered insulating layer 146, a third interlayered insulating layer 136, and a fourth interlayered insulating layer 126 may be stacked on the lower interlayered insulating layer 102. The first interlayered insulating layer 156 may be provided on the lower interlayered insulating layer 102, and the second interlayered insulating layer 146 may be provided between the lower interlayered insulating layer 102 and the first interlayered insulating layer 156. The third interlayered insulating layer 136 may be provided between the second interlayered insulating layer 146 and the lower interlayered insulating layer 102, and the fourth interlayered insulating layer 126 may be provided between the third interlayered insulating layer 136 and the lower interlayered insulating layer 102. The first to fourth interlayered insulating layers 156, 146, 136, and 126 may be formed of or include oxide, nitride, and/or oxynitride.

A first interconnection group 150 including first interconnection patterns 152 may be provided in the first interlayered insulating layer 156. The first interconnection patterns 152 may be provided to penetrate an upper portion of the first interlayered insulating layer 156. In some example embodiments, the first interconnection patterns 152 may have top surfaces 152a that are substantially coplanar (e.g., coplanar within manufacturing tolerances and/or material tolerances) with that 156a of the first interlayered insulating layer 156. When viewed in a plan view, the first interconnection patterns 152 on the first memory region R1 may extend in a first direction D1 and may be spaced apart from each other in a second direction D2 crossing the first direction D1. When viewed in a plan view, the first interconnection patterns 152 on the second memory region R2 may extend in the first direction D1 and may be spaced apart from each other in the second direction D2, but the inventive concepts are not limited thereto. In some example embodiments, although not illustrated, the first interconnection patterns 152 on the second memory region R2 may differ from the first interconnection patterns 152 on the first memory region R1 in terms of their extension or arrangement direction. A first variable resistance pattern VR1 may be provided in the first interlayered insulating layer 156 on the first memory region R1. The first variable resistance pattern VR1 may be provided to penetrate a lower portion of the first interlayered insulating layer 156 and to be connected to a corresponding one of the first interconnection patterns 152. In some example embodiments, an interconnection pattern may be connected to an uppermost variable resistance pattern. The first variable resistance pattern VR1 may be positioned at a first height H1 from the substrate 100. A first contact pattern 154 may be provided in the first interlayered insulating layer 156 on the second memory region R2. The first contact pattern 154 may be provided to penetrate the lower portion of the first interlayered insulating layer 156 and to be connected to a corresponding one of the first interconnection patterns 152. The first interconnection patterns 152 and the first contact pattern 154 may be formed of or include a metallic material (e.g., copper (Cu)).

A second interconnection group 140 including second interconnection patterns 142 may be provided in the second interlayered insulating layer 146. The second interconnection group 140 may be provided between the substrate 100 and the first interconnection group 150. The first variable resistance pattern VR1 and the first contact pattern 154 may be provided between the first interconnection group 150 and the second interconnection group 140. The second interconnection patterns 142 may be provided to penetrate an upper portion of the second interlayered insulating layer 146. In some example embodiments, the second interconnection patterns 142 may have top surfaces 142a that are substantially coplanar (e.g., coplanar within manufacturing tolerances and/or material tolerances) with that 146a of the second interlayered insulating layer 146. When viewed in a plan view, the second interconnection patterns 142 on the first memory region R1 may extend in a specific direction and may be spaced apart from each other in a direction crossing the specific direction. When viewed in a plan view, the second interconnection patterns 142 on the second memory region R2 may extend in the same direction as the second interconnection patterns 142 on the first memory region R1 and may be arranged in the same direction as the second interconnection patterns 142 on the first memory region R1, but the inventive concepts are not limited thereto. The first variable resistance pattern VR1 and the first contact pattern 154 may be respectively connected to corresponding ones of the second interconnection patterns 142. A second contact pattern 144 may be provided in the second interlayered insulating layer 146 on the first memory region R1. The second contact pattern 144 may be provided to penetrate a lower portion of the second interlayered insulating layer 146 and may be connected to the corresponding second interconnection pattern 142 connected to the first variable resistance pattern VR1. The second contact pattern 144 may be electrically connected to the first variable resistance pattern VR1 via the corresponding second interconnection pattern 142. A second variable resistance pattern VR2 may be provided in the second interlayered insulating layer 146 on the second memory region R2. The second variable resistance pattern VR2 may be provided to penetrate a lower portion of the second interlayered insulating layer 146 and may be connected to the corresponding second interconnection pattern 142 connected to the first contact pattern 154. The second variable resistance pattern VR2 may be electrically connected to the first contact pattern 154 via the corresponding second interconnection pattern 142. The second variable resistance pattern VR2 may be positioned ("located") at a second height H2 from the substrate 100. The second height H2 may be less than the first height H1.

The second interconnection patterns 142 and the second contact pattern 144 may be formed of or include a metallic material (e.g., copper (Cu)).

A third interconnection group 130 including third interconnection patterns 132 may be provided in the third interlayered insulating layer 136. The third interconnection group 130 may be provided between the substrate 100 and the second interconnection group 140. The second variable resistance pattern VR2 and the second contact pattern 144 may be provided between the second interconnection group 140 and the third interconnection group 130. The third interconnection patterns 132 may be provided to penetrate an upper portion of the third interlayered insulating layer 136. In some example embodiments, the third interconnection patterns 132 may have top surfaces 132a that are substantially coplanar (e.g., coplanar within manufacturing tolerances and/or material tolerances) with that 136a of the third interlayered insulating layer 136. When viewed in a plan view, the third interconnection patterns 132 on the first memory region R1 may extend in a specific direction and may be spaced apart from each other in a direction crossing the specific direction. When viewed in a plan view, the third interconnection patterns 132 on the second memory region R2 may extend in the same direction as the third interconnection patterns 132 on the first memory region R1 and may be arranged in the same direction as the third interconnection patterns 132 on the first memory region R1, but the inventive concepts are not limited thereto. The second variable resistance pattern VR2 and the second contact pattern 144 may be connected to corresponding ones of the third interconnection patterns 132, respectively. Third contact patterns 134 may be provided in the third interlayered insulating layer 136. The third contact patterns 134 may be provided on the first and second memory regions R1 and R2, respectively. The third contact patterns 134 may be provided to penetrate a lower portion of the third interlayered insulating layer 136. One of the third contact patterns 134 may be connected to the corresponding third interconnection pattern 132 connected to the second contact pattern 144, and another of the third contact patterns 134 may be connected the corresponding third interconnection pattern 132 connected to the second variable resistance pattern VR2. The third interconnection patterns 132 and the third contact patterns 134 may be formed of or include a metallic material (e.g., copper (Cu)).

A fourth interconnection group 120 including fourth interconnection patterns 122 may be provided in the fourth interlayered insulating layer 126. The fourth interconnection group 120 may be provided between the substrate 100 and the third interconnection group 130. The third contact patterns 134 may be provided between the third interconnection group 130 and the fourth interconnection group 120. The fourth interconnection patterns 122 may be provided to penetrate an upper portion of the fourth interlayered insulating layer 126. In some example embodiments, the fourth interconnection patterns 122 may have top surfaces 122a that are substantially coplanar (e.g., coplanar within manufacturing tolerances and/or material tolerances) with that 126a of the fourth interlayered insulating layer 126. When viewed in a plan view, the fourth interconnection patterns 122 on the first memory region R1 may extend in a specific direction and may be spaced apart from each other in a direction crossing the specific direction. When viewed in a plan view, the fourth interconnection patterns 122 on the second memory region R2 may extend in the same direction as the fourth interconnection patterns 122 on the first memory region R1 and may be arranged in the same direction as the fourth interconnection patterns 122 on the first memory region R1, but the inventive concepts are not limited thereto. The third contact patterns 134 may be respectively connected to corresponding ones of the fourth interconnection patterns 122. Fourth contact patterns 124 may be provided in the fourth interlayered insulating layer 126. The fourth contact patterns 124 may be provided on the first and second memory regions R1 and R2, respectively. The fourth contact patterns 124 may be provided to penetrate a lower portion of the fourth interlayered insulating layer 126 and may be respectively connected to the corresponding fourth interconnection patterns 122 connected to the third contact patterns 134. The fourth contact patterns 124 may be respectively connected to corresponding ones of the interconnection lines 106 in the interconnection structure 110. The fourth interconnection patterns 122 and the fourth contact patterns 124 may be formed of or include a metallic material (e.g., copper (Cu)).

The first variable resistance pattern VR1 may be coupled to a terminal of a corresponding one of the selection elements provided on the substrate 100. For example, the first variable resistance pattern VR1 may be connected to a corresponding one of the interconnection lines 106 in the interconnection structure 110 through the second interconnection pattern 142, the second contact pattern 144, the third interconnection pattern 132, the third contact pattern 134, the fourth interconnection pattern 122, and the fourth contact pattern 124, which are electrically connected thereto, and may be coupled to the corresponding selection element through the corresponding interconnection line 106. By applying a voltage to the first interconnection pattern 152, it may be possible to control the first variable resistance pattern VR1. Restated, the first variable resistance pattern VR1 may be controlled based on application of a voltage through the first interconnection pattern 152.

The second variable resistance pattern VR2 may be coupled to a terminal of a corresponding one of the selection elements provided on the substrate 100. For example, the second variable resistance pattern VR2 may be connected to a corresponding one of the interconnection lines 106 in the interconnection structure 110 through the third interconnection pattern 132, the third contact pattern 134, the fourth interconnection pattern 122, and the fourth contact pattern 124, which are electrically connected thereto, and may be coupled to the corresponding selection element through the corresponding interconnection line 106. By applying a voltage to the second variable resistance pattern VR2 through the first interconnection pattern 152, the first contact pattern 154, and the second interconnection pattern 142, it may be possible to control the second variable resistance pattern VR2. Restated, the second variable resistance pattern VR2 may be controlled based on application of a separate voltage through the first interconnection pattern 152.

A plurality of the first variable resistance patterns VR1 may be provided on the first memory region R1 of the substrate 100. As an example, when viewed in a plan view, a plurality of the first variable resistance patterns VR1 may be arranged in the first and second directions D1 and D2. The first variable resistance patterns VR1 arranged in the first direction D1 may be connected in common to a corresponding one of the first interconnection patterns 152. The first variable resistance patterns VR1 arranged in the second direction D2 may be respectively connected to corresponding ones of the first interconnection patterns 152. The plurality of first variable resistance patterns VR1 may be respectively connected to corresponding ones of the selection elements. A plurality of the second variable resistance patterns VR2 may be provided on the second memory region R2 of the substrate 100. As an example, when viewed in a plan view, a plurality of the second variable resistance patterns VR2 may be arranged in both of the first and second directions D1 and D2. The second variable resistance patterns VR2 arranged in the first direction D1 may be connected in common to a corresponding one of the first interconnection patterns 152. The second variable resistance patterns VR2 arranged in the second direction D2 may be respectively connected to corresponding ones of the first interconnection patterns 152. The plurality of second variable resistance patterns VR2 may be respectively connected to corresponding ones of the selection elements.

Each of the first and second variable resistance patterns VR1 and VR2 may have a structure, in which two ferromagnetic layers are provided, and whose electric resistance is dependent on whether magnetization directions of the ferromagnetic layers are parallel or anti-parallel to each other. For example, each of the first and second variable resistance patterns VR1 and VR2 may include a magnetic tunnel junction pattern, which is used as a part of an MRAM cell. Referring to FIGS. 3A and 3B, each of the first and second variable resistance patterns VR1 and VR2 may include a bottom electrode BE, a pinned pattern PNL, a tunnel barrier pattern TBR, a free pattern FRL, and a top electrode TE, which are sequentially stacked on the substrate 100. The pinned pattern PNL may have a fixed magnetization direction 160a, and the free pattern FRL may have a magnetization direction 160b that can be changed to be parallel or antiparallel to the magnetization direction 160a of the pinned pattern PNL. The bottom electrode BE of the first variable resistance pattern VR1 may be connected to a corresponding one of the second interconnection patterns 142, and the top electrode TE of the first variable resistance pattern VR1 may be connected to a corresponding one of the first interconnection patterns 152. The bottom electrode BE of the second variable resistance pattern VR2 may be connected to a corresponding one of the third interconnection patterns 132, and the top electrode TE of the second variable resistance pattern VR2 may be connected to a corresponding one of the second interconnection patterns 142. Although FIGS. 3A and 3B illustrate an example in which the pinned pattern PNL is provided between the bottom electrode BE and the tunnel barrier pattern TBR and the free pattern FRL is provided between the top electrode TE and the tunnel barrier pattern TBR, but the inventive concepts are not limited thereto. Unlike that shown in FIGS. 3A and 3B, the pinned pattern PNL may be provided between the top electrode TE and the tunnel barrier pattern TBR, and the free pattern FRL may be provided between the bottom electrode BE and the tunnel barrier pattern TBR. Referring to FIG. 3A, the magnetization directions 160a and 160b of the pinned pattern PNL and the free pattern FRL may be substantially parallel (e.g., parallel within manufacturing tolerances and/or material tolerances) to an interface between the free pattern FRL and the tunnel barrier pattern TBR. In this case, each of the pinned pattern PNL and the free pattern FRL may be formed of or include a ferromagnetic material. The pinned pattern PNL may further include an anti-ferromagnetic material for fixing a magnetization direction of the ferromagnetic material. Referring to FIG. 3B, the magnetization directions 160a and 160b of the pinned pattern PNL and the free pattern FRL may be substantially perpendicular (e.g., perpendicular within manufacturing tolerances and/or material tolerances) to an interface between the free pattern FRL and the tunnel barrier pattern TBR. In this case, each of the pinned pattern PNL and the free pattern FRL may include at least one of perpendicular magnetic materials (e.g., CoFeTb, CoFeGd, and CoFeDy), perpendicular magnetic materials with $L1_0$ structure, CoPt-based materials with hexagonal-close-packed structure, and perpendicular magnetic structures. The perpendicular magnetic material with the $L1_0$ may include at least one of $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers. Here, the pinned pattern PNL may be thicker than the free pattern FRL or may be configured to have a coercive force greater than that of the free pattern FRL.

In some example embodiments, each of the first and second variable resistance patterns VR1 and VR2 may include a material, allowing a current path of low resistance to be created by applying a high voltage is applied thereto. Each of the first and second variable resistance patterns VR1 and VR2 may include at least one of, for example, metal oxides (e.g., TiOx, HfOx, TaOx, NiOx, ZrOx, and WOx), metal nitrides (e.g., BNx and AlNx), perovskite oxides (e.g., PrCaMnO and doped-SrTiO), or solid electrolytes (e.g., GeTe and GeS) in which metal ions (e.g., Cu and Ag) with high diffusivity are contained. In this case, each of the first and second variable resistance patterns VR1 and VR2 may be used as a part of an RRAM cell.

In some example embodiments, each of the first and second variable resistance patterns VR1 and VR2 may include a phase changeable material, which may be switched from a high resistance (amorphous) state to a low resistance (crystalline) state and back again, depending on temperature and a heating time, and the temperature and heating time may be controlled by adjusting an electric current to be applied to each of the first and second variable resistance patterns VR1 and VR2. Each of the first and second variable resistance patterns VR1 and VR2 may include at least one of chalcogenide compounds, whose crystallographic structure can be reversibly switched between a high resistance amorphous structure and a low resistance crystalline structure, using the Joule heating effect. In this case, each of the first and second variable resistance patterns VR1 and VR2 may be used as a part of a PRAM cell.

Referring to FIGS. 4A and 4B, the first variable resistance pattern VR1 may be used as a part of a first memory cell MC1 on the first memory region R1, and the second variable resistance pattern VR2 may be used as a part of a second memory cell MC2 on the second memory region R2. Each of the first and second memory cells MC1 and MC2 may include a memory element ME and a selection element SE. The memory element ME may be provided in series between the selection element SE and a bit line BL, and the selection element SE may be provided in series between the memory element ME and a word line WL. The selection element SE may be configured to selectively control a current flow of an electric current passing through the memory element ME. As an example, the selection element SE may be one of a diode, a pnp bipolar transistor, an npn bipolar transistor, an NMOS field effect transistor, and a PMOS field effect transistor. In the case where the selection element SE is a three-terminal switching device, such as bipolar transistors and MOSFETs, a source electrode of the selection element SE may be connected to a source line SL. A write voltage may be applied to the memory element ME through the bit line BL to write data to the memory element ME, and a read voltage may be applied to the memory element ME through the bit line BL to read out data from the memory element ME. A selection element SE may be connected to a lowermost variable resistance pattern of the variable resistance patterns in a memory element ME.

The first variable resistance pattern VR1 may be configured to serve as the memory element ME of the first memory cell MC1, and the second variable resistance pattern VR2 may be configured to serve as the memory element ME of the second memory cell MC2. At least one of shapes, thicknesses, materials, or chemical structures of layers of the first variable resistance pattern VR1 may be different from that of layers of the second variable resistance pattern VR2. As referred to herein, shapes, thicknesses, materials, or chemical structures of layers of a variable resistance pattern may be referred to as intrinsic properties of the variable resistance pattern, such that the second variable resistance pattern VR2 may include at least one intrinsic property that is different from a corresponding at least one intrinsic property of the first variable resistance pattern VR1. The first variable resistance pattern VR1 may be configured to have resistance values r1 different form resistance values r2 of the second variable resistance pattern VR2. As an example, the resistance values r1 of the first variable resistance pattern VR1 may be greater than the resistance values r2 of the second variable resistance pattern VR2 (i.e., r1>r2). A critical value of current, voltage, time, or the like, which is associated with a data switching operation of changing data from a low resistance state to a high resistance state or from a high resistance state to a low resistance state, may be greater for the first variable resistance pattern VR1 than for the second variable resistance pattern VR2. In the case where each of the first and second variable resistance patterns VR1 and VR2 includes the magnetic tunnel junction pattern described with reference to FIGS. 3A and 3B, a critical current density associated with a data switching operation may be higher for the first variable resistance pattern VR1 (e.g., the first magnetic tunnel junction pattern) than for the second variable resistance pattern VR2 (e.g., the second magnetic tunnel junction pattern). In this case, the second variable resistance pattern VR2 may be more easily switched than the first variable resistance pattern VR1, and the first variable resistance pattern VR1 may have an improved retention property, compared with the second variable resistance pattern VR2. Thus, the first memory cell MC1 including the first variable resistance pattern VR1 may be used as a non-volatile memory (NVM) cell, and the second memory cell MC2 including the second variable resistance pattern VR2 may be used as a random access memory (RAM) cell.

According to some example embodiments of the inventive concepts, the first variable resistance pattern VR1 may be provided between the first interconnection group 150 and the second interconnection group 140, and the second variable resistance pattern VR2 may be provided between the second interconnection group 140 and the third interconnection group 130. Since the first and second variable resistance patterns VR1 and VR2 are provided at different levels from the substrate 100, it may be possible to easily provide the first and second variable resistance patterns VR1 and VR2, whose switching characteristics are different from each other, on the single substrate 100. In addition, the resistance values r1 of the first variable resistance pattern VR1 and the resistance values r2 of the second variable resistance pattern VR2 may be different from each other, and each of the first and second variable resistance patterns VR1 and VR2 may be used as a part of a corresponding one of the first and second memory cells MC1 and MC2. Accordingly, it may be possible to provide a variable resistance memory device including the first and second memory cells MC1 and MC2 with different resistance levels.

Figure 5:
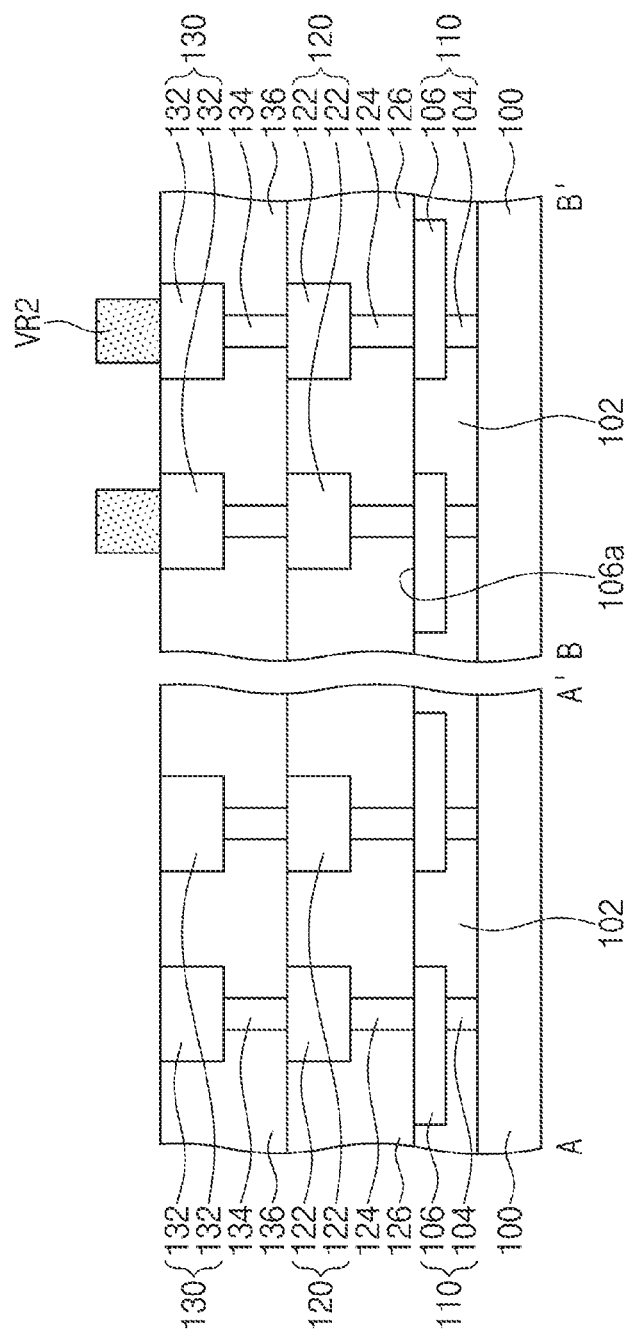
FIG. 5 and FIG. 6 are sectional views, each of which is taken along lines A-A' and B-B' of FIG. 1 to describe a method of fabricating a variable resistance memory device according to some example embodiments of the inventive concepts.
Figure 6:
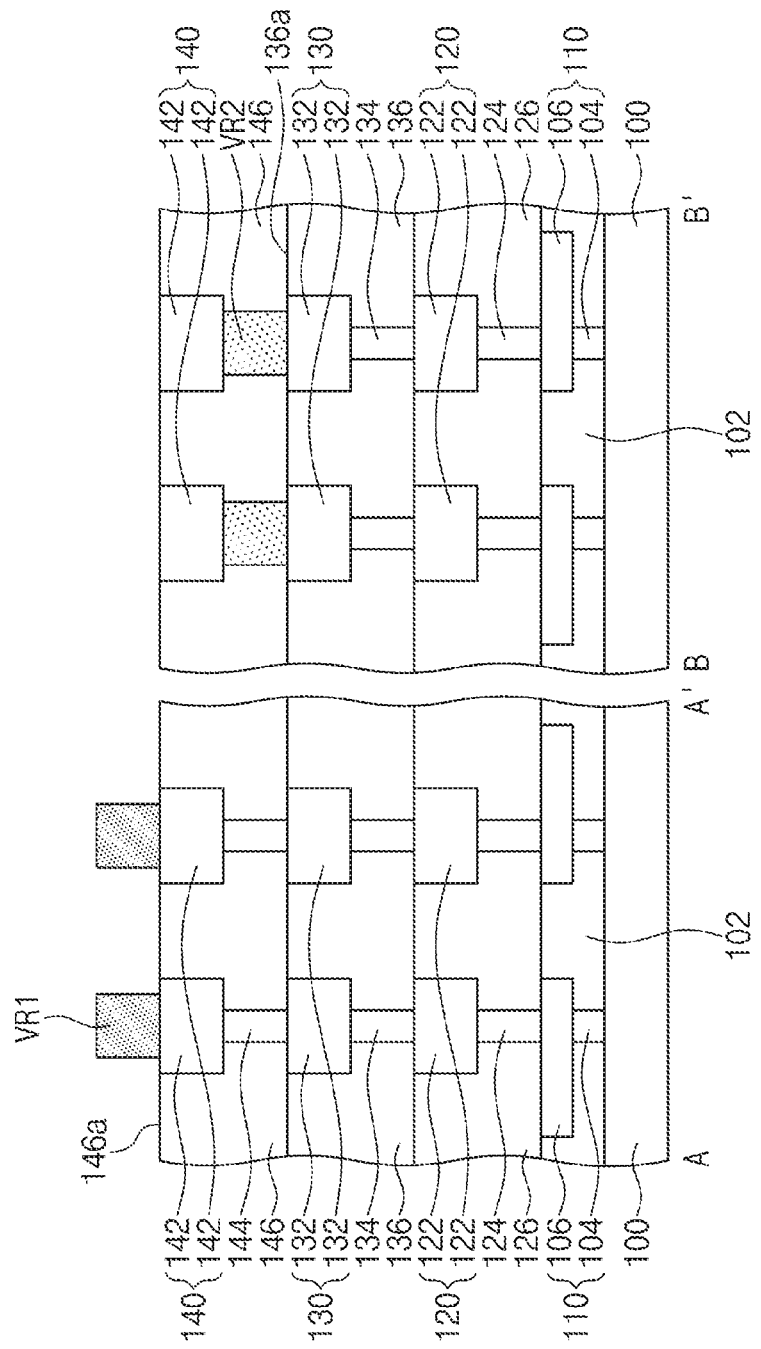

FIG. 5 and FIG. 6 are sectional views, each of which is taken along lines A-A' and B-B' of FIG. 1 to describe a method of fabricating a variable resistance memory device according to some example embodiments of the inventive concepts.

Referring to FIGS. 1 and 5, the substrate 100 including the first and second memory regions R1 and R2 may be provided. The selection elements may be formed on the substrate 100, and the lower interlayered insulating layer 102 may be formed on the substrate 100 to cover the selection elements. The interconnection structure 110 may be formed in the lower interlayered insulating layer 102. The interconnection structure 110 may include the interconnection lines 106 spaced apart from the substrate 100 and the contacts 104 connected to the interconnection lines 106. In some example embodiments, the interconnection lines 106 may have top surfaces 106a that are substantially coplanar (e.g., coplanar within manufacturing tolerances and/or material tolerances) with that of the lower interlayered insulating layer 102.

The fourth interlayered insulating layer 126 may be formed on the lower interlayered insulating layer 102. The fourth interconnection patterns 122 and the fourth contact patterns 124 may be formed in the fourth interlayered insulating layer 126. The fourth interconnection patterns 122 constituting the fourth interconnection group 120 may be formed at substantially the same height (e.g., at a substantially common height) from the substrate 100. The fourth contact patterns 124 may be formed between the lower interlayered insulating layer 102 and the fourth interconnection group 120. The fourth contact patterns 124 may be formed on the first and second memory regions R1 and R2, respectively. For example, the formation of the fourth interconnection patterns 122 and the fourth contact patterns 124 may include forming interconnection trenches to penetrate an upper portion of the fourth interlayered insulating layer 126, forming contact holes, which are respectively extended from bottom surfaces of the interconnection trenches to penetrate a lower portion of the fourth interlayered insulating layer 126, forming a conductive layer on the fourth interlayered insulating layer 126 to fill the interconnection trenches and the contact holes, and planarizing the conductive layer to expose a top surface of the fourth interlayered insulating layer 126. Each of the fourth contact patterns 124 may be formed to electrically connect a corresponding one of the fourth interconnection patterns 122 to a corresponding one of the interconnection lines 106.

The third interlayered insulating layer 136 may be formed on the fourth interlayered insulating layer 126. The third interconnection patterns 132 and the third contact patterns 134 may be formed in the third interlayered insulating layer 136. The third interconnection patterns 132 constituting the third interconnection group 130 may be formed at substantially the same height from the substrate 100. The third contact patterns 134 may be formed between the fourth interlayered insulating layer 126 and the third interconnection group 130. The third contact patterns 134 may be formed on the first and second memory regions R1 and R2, respectively. In some example embodiments, the third interconnection patterns 132 and the third contact patterns 134 may be formed by substantially the same method as that for forming the fourth interconnection patterns 122 and the fourth contact patterns 124. Each of the third contact patterns 134 may be formed to electrically connect a corresponding one of the third interconnection patterns 132 to a corresponding one of the fourth interconnection patterns 122.

The second variable resistance pattern VR2 may be formed on the second memory region R2 and on the third interlayered insulating layer 136. In the case where the second variable resistance pattern VR2 includes the magnetic tunnel junction pattern described with reference to FIGS. 3A and 3B, the formation of the second variable resistance pattern VR2 may include sequentially forming a bottom electrode layer, a pinned layer, a tunnel barrier layer, a free layer, and a top electrode layer on the third interlayered insulating layer 136 and sequentially etching the top electrode layer, the free layer, the tunnel barrier layer, the pinned layer, and the bottom electrode layer to form the top electrode TE, the free pattern FRL, the tunnel barrier pattern TBR, the pinned pattern PNL, and the bottom electrode BE. The sequentially stacking of the bottom electrode layer, the pinned layer, the tunnel barrier layer, the free layer, and the top electrode layer may be performed using, for example, a chemical vapor deposition process, a physical vapor deposition process, and a sputtering process. The bottom electrode BE, the pinned pattern PNL, the tunnel barrier pattern TBR, the free pattern FRL, and the top electrode TE, which are sequentially stacked on the second memory region R2 and on the third interlayered insulating layer 136, may constitute the second variable resistance pattern VR2. The resistance values r2 of the second variable resistance pattern VR2 may be determined by at least one of shapes, thicknesses, materials, or chemical structures of layers constituting of the second variable resistance pattern VR2.

Referring to FIGS. 1 and 6, the second interlayered insulating layer 146 may be formed on the third interlayered insulating layer 136. The second interlayered insulating layer 146 may cover a top surface 136a of the third interlayered insulating layer 136 on the first memory region R1 and may be extended onto the second memory region R2 to cover the second variable resistance pattern VR2 and the third interlayered insulating layer 136. The second interconnection patterns 142 and the second contact pattern 144 may be formed in the second interlayered insulating layer 146. The second interconnection patterns 142 may be formed at substantially the same height from the substrate 100 to constitute the second interconnection group 140. The second contact pattern 144 may be formed between the third interlayered insulating layer 136 on the first memory region R1 and the second interconnection group 140. The formation of the second interconnection patterns 142 and the second contact pattern 144 may include forming interconnection trenches to penetrate an upper portion of the second interlayered insulating layer 146, forming a contact hole, which is extended from a bottom surface of each of the interconnection trenches on the first memory region R1 to penetrate a lower portion of the second interlayered insulating layer 146, forming a conductive layer on the second interlayered insulating layer 146 to fill the interconnection trenches and the contact hole, and planarizing the conductive layer to expose a top surface 146a of the second interlayered insulating layer 146. The second contact pattern 144 may be provided to electrically connect a corresponding one of the second interconnection patterns 142 to a corresponding one of the third interconnection patterns 132. The second variable resistance pattern VR2 may be connected to a corresponding one of the second interconnection patterns 142 and a corresponding one of the third interconnection patterns 132.

The first variable resistance pattern VR1 may be formed on the first memory region R1 and on the second interlayered insulating layer 146. In the case where the first variable resistance pattern VR1 includes the magnetic tunnel junction pattern described with reference to FIGS. 3A and 3B, the first variable resistance pattern VR1 may be formed by substantially the same method as that for the second variable resistance pattern VR2. The bottom electrode BE, the pinned pattern PNL, the tunnel barrier pattern TBR, the free pattern FRL, and the top electrode TE, which are sequentially stacked on the first memory region R1 and on the second interlayered insulating layer 146, may constitute the first variable resistance pattern VR1. The resistance values r1 of the first variable resistance pattern VR1 may be determined by at least one of shapes, thicknesses, materials, or chemical structures of layers constituting of the first variable resistance pattern VR1. The resistance values r1 of the first variable resistance pattern VR1 may be different from the resistance values r2 of the second variable resistance pattern VR2. The first variable resistance pattern VR1 may be formed to have switching (or retention) characteristics that are different from those of the second variable resistance pattern VR2.

Referring back to FIGS. 1 and 2, the first interlayered insulating layer 156 may be formed on the second interlayered insulating layer 146. The first interlayered insulating layer 156 may be provided on the first memory region R1 and on the second interlayered insulating layer 146 to cover the first variable resistance pattern VR1 and may be extended on the second memory region R2 to cover the top surface 146a of the second interlayered insulating layer 146. The first interconnection patterns 152 and the first contact pattern 154 may be formed in the first interlayered insulating layer 156. The first interconnection patterns 152 may be formed at substantially the same height from the substrate 100 to constitute the first interconnection group 150. The first contact pattern 154 may be formed between the second interlayered insulating layer 146 on the second memory region R2 and the first interconnection group 150. In some example embodiments, the formation of the first interconnection patterns 152 and the first contact pattern 154 may include forming interconnection trenches to penetrate an upper portion of the first interlayered insulating layer 156, forming a contact hole to be extended from a bottom surface of each of the interconnection trenches on the second memory region R2 and penetrate a lower portion of the first interlayered insulating layer 156, forming a conductive layer on the first interlayered insulating layer 156 to fill the interconnection trenches and the contact hole, and planarizing the conductive layer to expose a top surface 156a of the first interlayered insulating layer 156. The first contact pattern 154 may be formed to electrically connect a corresponding one of the first interconnection patterns 152 to a corresponding one of the second interconnection patterns 142. The first variable resistance pattern VR1 may be connected to a corresponding one of the first interconnection patterns 152 and a corresponding one of the second interconnection patterns 142.

Figure 7:
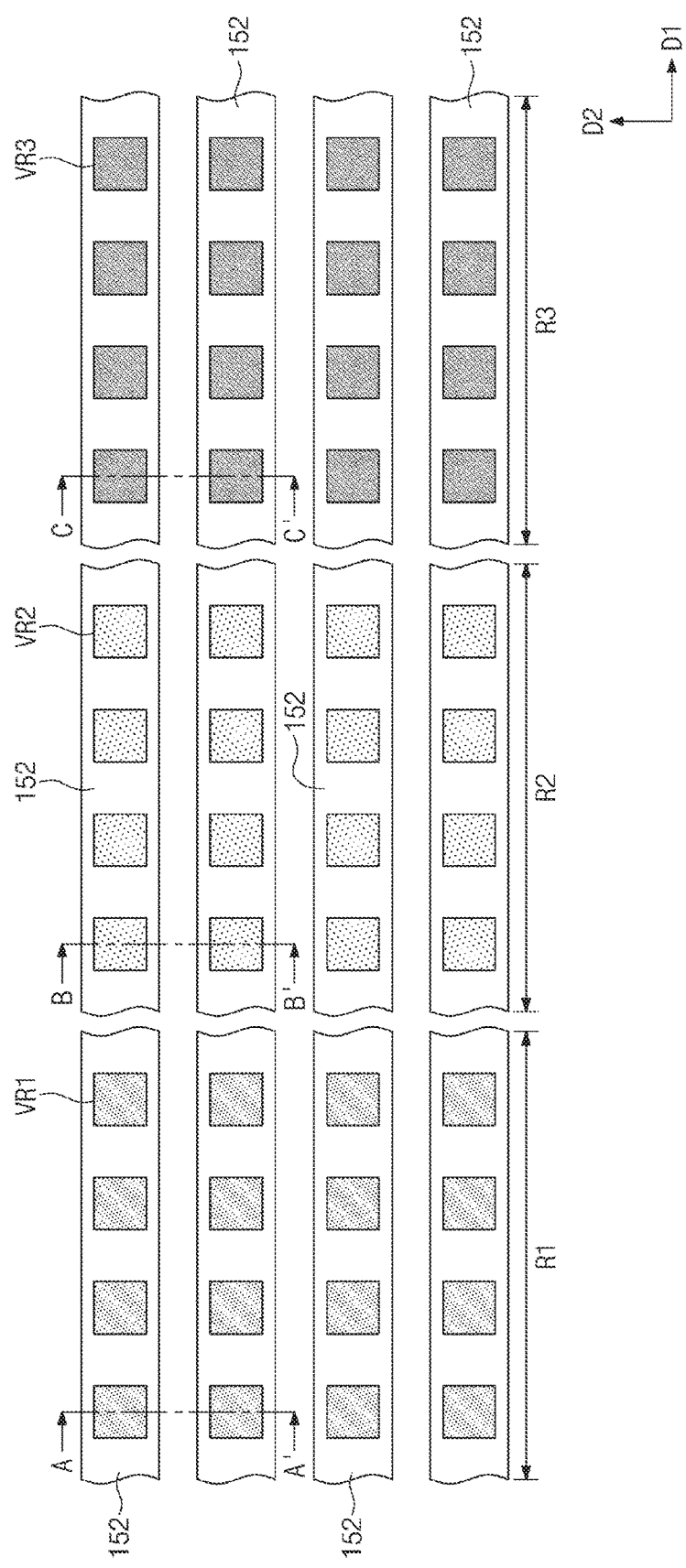
FIG. 7 is a plan view illustrating a variable resistance memory device according to some example embodiments of the inventive concepts.
Figure 8:
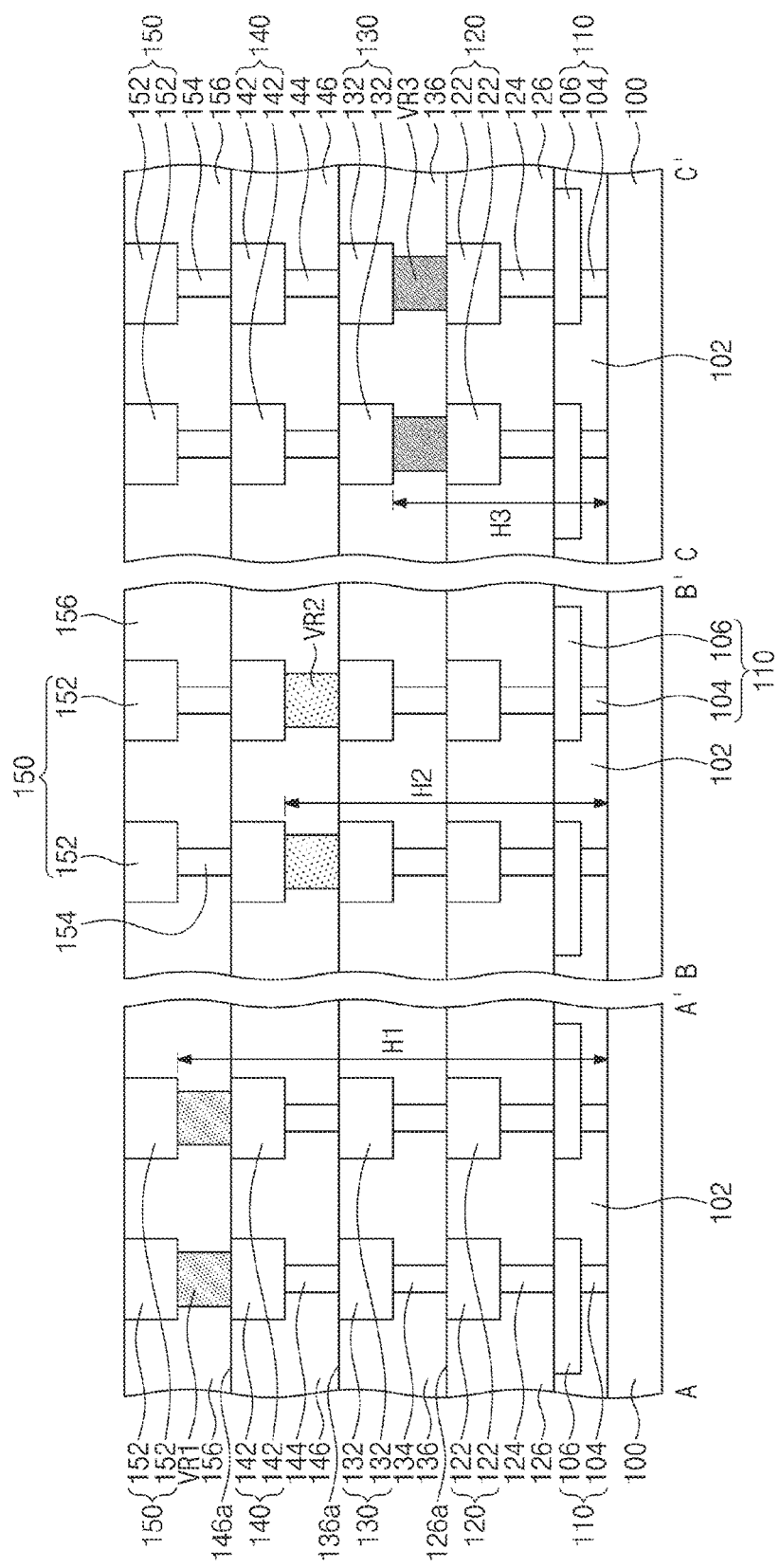
FIG. 8 is a sectional view taken along lines A-A', B-B', and C-C' of FIG. 7.
Figure 9:
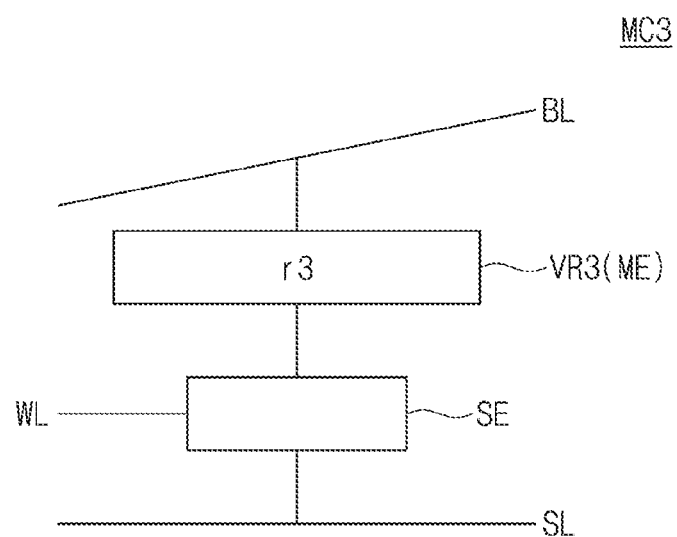
FIG. 9 is a circuit diagram illustrating a unit memory cell, which is provided in a third memory region of a variable resistance memory device according to some example embodiments of the inventive concepts.

FIG. 7 is a plan view illustrating a variable resistance memory device according to some example embodiments of the inventive concepts, and FIG. 8 is a sectional view taken along lines A-A', B-B', and C-C' of FIG. 7. FIG. 9 is a circuit diagram illustrating a unit memory cell, which is provided in a third memory region of a variable resistance memory device according to some example embodiments of the inventive concepts. In the following description, an element previously described with reference to FIGS. 1, 2, 3A, 3B, 4A, and 4B may be identified by a similar or identical reference number without repeating an overlapping description thereof, for the sake of brevity.

Referring to FIGS. 7 and 8, the substrate 100 may further include a third memory region R3. The first memory region R1, the second memory region R2, and the third memory region R3 may be different regions of the substrate 100, which are spaced apart from each other. The first memory region R1 may be a region of the substrate 100, on which memory cells are provided, and the second memory region R2 may be another region of the substrate 100, on which additional memory cells are provided. The third memory region R3 may be other region of the substrate 100, on which additional memory cells are provided.

The lower interlayered insulating layer 102 may be provided on the substrate 100, and the interconnection structure 110 may be provided in the lower interlayered insulating layer 102. A first interlayered insulating layer 156, a second interlayered insulating layer 146, a third interlayered insulating layer 136, and a fourth interlayered insulating layer 126 may be stacked on the lower interlayered insulating layer 102.

The first interconnection group 150 including the first interconnection patterns 152 may be provided in the first interlayered insulating layer 156. When viewed in a plan view, the first interconnection patterns 152 on the third memory region R3 may extend in the first direction D1 and may be spaced apart from each other in the second direction D2, but the inventive concepts are not limited thereto. In some example embodiments, although not illustrated, the first interconnection patterns 152 on the third memory region R3 may extend or be arranged in a direction different from that of the first interconnection patterns 152 on the first and second memory regions R1 and R2. The first variable resistance pattern VR1 may be provided in the first interlayered insulating layer 156 and on the first memory region R1. The first variable resistance pattern VR1 may be positioned at the first height H1 from the substrate 100. The first variable resistance pattern VR1 may be connected to a corresponding one of the first interconnection patterns 152. First contact patterns 154 may be provided in the first interlayered insulating layer 156 and on the second and third memory regions R2 and R3, respectively. The first contact patterns 154 may be connected to corresponding ones of the first interconnection patterns 152, respectively.

The second interconnection group 140 including the second interconnection patterns 142 may be provided in the second interlayered insulating layer 146. When viewed in a plan view, the second interconnection patterns 142 on the third memory region R3 may extend in the same direction as the second interconnection patterns 142 on the first and second memory regions R1 and R2 and may be arranged in the same direction as the second interconnection patterns 142 on the first and second memory regions R1 and R2, but the inventive concepts are not limited thereto. The first variable resistance pattern VR1 and the first contact patterns 154 may be respectively connected to corresponding ones of the second interconnection patterns 142. The second variable resistance pattern VR2 may be provided in the second interlayered insulating layer 146 on the second memory region R2. The second variable resistance pattern VR2 may be positioned at the second height H2 from the substrate 100. The second variable resistance pattern VR2 may be connected to the corresponding second interconnection pattern 142, which is provided on the second memory region R2 and is connected to the first contact pattern 154. Second contact patterns 144 may be provided in the second interlayered insulating layer 146 and on the first and third memory regions R1 and R3, respectively. The second contact pattern 144 on the first memory region R1 may be connected to the corresponding second interconnection pattern 142, which is connected to the first variable resistance pattern VR1. The second contact pattern 144 on the third memory region R3 may be connected to the corresponding second interconnection pattern 142, which is provided on the third memory region R3 and is connected to the first contact pattern 154.

The third interconnection group 130 including the third interconnection patterns 132 may be provided in the third interlayered insulating layer 136. When viewed in a plan view, the third interconnection patterns 132 on the third memory region R3 may extend in the same direction as the third interconnection patterns 132 on the first and second memory regions R1 and R2 and may be arranged in the same direction as the third interconnection patterns 132 on the first and second memory regions R1 and R2, but the inventive concepts are not limited thereto. The second variable resistance pattern VR2 and the second contact patterns 144 may be respectively connected to corresponding ones of the third interconnection patterns 132. A third variable resistance pattern VR3 may be provided in the third interlayered insulating layer 136 and on the third memory region R3. The third variable resistance pattern VR3 may be positioned at a third height H3 from the substrate 100. The third height H3 may be lower than the first height H1 and the second height H2. The third variable resistance pattern VR3 may be provided to penetrate a lower portion of the third interlayered insulating layer 136 and may be connected to the corresponding third interconnection pattern 132, which is provided on the third memory region R3 and is connected to the second contact pattern 144. The third contact patterns 134 may be provided in the third interlayered insulating layer 136 and on the first and second memory regions R1 and R2, respectively. The third contact pattern 134 on the first memory region R1 may be connected to the corresponding third interconnection pattern 132, which is provided on the first memory region R1 and is connected to the second contact pattern 144. The third contact pattern 134 on the second memory region R2 may be connected to the corresponding third interconnection pattern 132, which is connected to the second variable resistance pattern VR2.

The fourth interconnection group 120 including the fourth interconnection patterns 122 may be provided in the fourth interlayered insulating layer 126. The third variable resistance pattern VR3 and the third contact patterns 134 may be provided between the third interconnection group 130 and the fourth interconnection group 120. When viewed in a plan view, the fourth interconnection patterns 122 on the third memory region R3 may extend in the same direction as the fourth interconnection patterns 122 on the first and second memory regions R1 and R2 and may be arranged in the same direction as the fourth interconnection patterns 122, but the inventive concepts are not limited thereto. The third variable resistance pattern VR3 and the third contact patterns 134 may be respectively connected to corresponding ones of the fourth interconnection patterns 122. Fourth contact patterns 124 may be provided in the fourth interlayered insulating layer 126. The fourth contact patterns 124 may be provided on the first memory region R1, the second memory region R2, and the third memory region R3, respectively. The fourth contact pattern 124 on the first memory region R1 may be connected to the corresponding fourth interconnection pattern 122, which is connected to the third contact pattern 134 on the first memory region R1. The fourth contact pattern 124 on the second memory region R2 may be connected to the corresponding fourth interconnection pattern 122, which is connected to the third contact pattern 134 on the second memory region R2. The fourth contact pattern 124 on the third memory region R3 may be connected to the corresponding fourth interconnection pattern 122, which is connected to the third variable resistance pattern VR3. The fourth contact patterns 124 may be connected to respective ones of the interconnection lines 106 in the interconnection structure 110.

The third variable resistance pattern VR3 may be coupled to a terminal of a corresponding one of the selection elements provided on the substrate 100. For example, the third variable resistance pattern VR3 may be connected to a corresponding one of the interconnection lines 106 in the interconnection structure 110 via the fourth interconnection pattern 122 and the fourth contact pattern 124, which are electrically connected thereto, and may be coupled to the corresponding selection element via the corresponding interconnection line 106. By applying a voltage to the first interconnection pattern 152, the first contact pattern 154, the second interconnection pattern 142, the second contact pattern 144, and the third interconnection pattern 132, which are electrically connected to the third variable resistance pattern VR3, it may be possible to control the third variable resistance pattern VR3.

A plurality of the third variable resistance patterns VR3 may be provided on the third memory region R3 of the substrate 100. As an example, when viewed in a plan view, a plurality of the third variable resistance patterns VR3 may be arranged in both of the first and second directions D1 and D2. The third variable resistance patterns VR3 arranged in the first direction D1 may be connected in common to a corresponding one of the first interconnection patterns 152. The third variable resistance patterns VR3 arranged in the second direction D2 may be respectively connected to corresponding ones of the first interconnection patterns 152. The plurality of the third variable resistance patterns VR3 may be coupled to corresponding ones of the selection elements, respectively.

The third variable resistance pattern VR3 may include a magnetic tunnel junction pattern, which is used as a part of an MRAM cell. In this case, as described with reference to FIGS. 3A and 3B, the third variable resistance pattern VR3 may include the bottom electrode BE, the pinned pattern PNL, the tunnel barrier pattern TBR, the free pattern FRL, and the top electrode TE, which are sequentially stacked on the substrate 100. The bottom electrode BE of the third variable resistance pattern VR3 may be connected to a corresponding one of the fourth interconnection patterns 122, and the top electrode TE of the third variable resistance pattern VR3 may be connected to a corresponding one of the third interconnection patterns 132. In some example embodiments, the third variable resistance pattern VR3 may be used as a part of an RRAM or PRAM cell.

Referring to FIG. 9, the third variable resistance pattern VR3 may be used as a part of a third memory cell MC3, which is provided on the third memory region R3. The third memory cell MC3 may include a memory element ME and a selection element SE. The memory element ME may be provided in series between the selection element SE and a bit line BL, and the selection element SE may be provided in series between the memory element ME and a word line WL. The selection element SE may be configured to selectively control a current flow of an electric current passing through the memory element ME. In the case where the selection element SE is a three-terminal switching device, such as bipolar transistors and MOSFETs, a source electrode of the selection element SE may be connected to a source line SL. A write voltage may be applied to the memory element ME through the bit line BL to write data to the memory element ME, and a read voltage may be applied to the memory element ME through the bit line BL to read out data from the memory element ME.

The third variable resistance pattern VR3 may be configured to serve as the memory element ME of the third memory cell MC3. At least one of shapes, thicknesses, materials, or chemical structures of layers constituting the third variable resistance pattern VR3 may be different from that of layers constituting each of the first and second variable resistance patterns VR1 and VR2. The third variable resistance pattern VR3 may be configured to have resistance values r3 different form the resistance values r1 and 2 of the first and second variable resistance patterns VR1 and VR2. In some example embodiments, the resistance values r1 of the first variable resistance pattern VR1 may be higher than the resistance values r2 of the second variable resistance pattern VR2, and the resistance values r2 of the second variable resistance pattern VR2 may be higher than the resistance values r3 of the third variable resistance pattern VR3 (i.e., r1>r2>r3). A critical value of current, voltage, time, or the like, which is associated with a data switching operation of changing data stored in the third variable resistance pattern VR3, may be smaller than those for the first and second variable resistance patterns VR1 and VR2. In the case where each of the first to third variable resistance patterns VR1, VR2, and VR3 includes the magnetic tunnel junction pattern described with reference to FIGS. 3A and 3B, a critical current density, which is associated with changing data of the third variable resistance pattern VR3 (i.e., to switch a magnetization direction of the third magnetic tunnel junction pattern), may be smaller than those of the first and second variable resistance patterns VR1 and VR2. In this case, the third variable resistance pattern VR3 may be more easily switched than the first and second variable resistance patterns VR1 and VR2. The second variable resistance pattern VR2 may be more easily switched than the first variable resistance pattern VR1 and may have an improved retention property, compared with the third variable resistance pattern VR3. The first variable resistance pattern VR1 may have an improved retention property, compared with the second and third variable resistance patterns VR2 and VR3. Thus, the first memory cell MC1 including the first variable resistance pattern VR1 may be used as a non-volatile memory (NVM) cell, the second memory cell MC2 including the second variable resistance pattern VR2 may be used as a non-volatile random access memory (NVRAM) cell, and the third memory cell MC3 including the third variable resistance pattern VR3 may be used as a random access memory (RAM) cell.

In the afore-described embodiments, since the first, second, and third variable resistance patterns VR1, VR2, and VR3 are provided at different levels from the substrate 100, it may be possible to easily provide the first, second, and third variable resistance patterns VR1, VR2, and VR3, whose switching characteristics are different from each other, on the single substrate 100. Furthermore, the resistances values r1, r2, and r3 of the first, second, and third variable resistance patterns VR1, VR2, and VR3 may be different from each other, and each of the first, second, and third variable resistance patterns VR1, VR2, and VR3 may be used as a part of a corresponding one of the first to third memory cells MC1, MC2, and MC3. Accordingly, it may be possible to provide a variable resistance memory device including the first to third memory cells MC1, MC2, and MC3 with different resistance levels.

Figure 10:
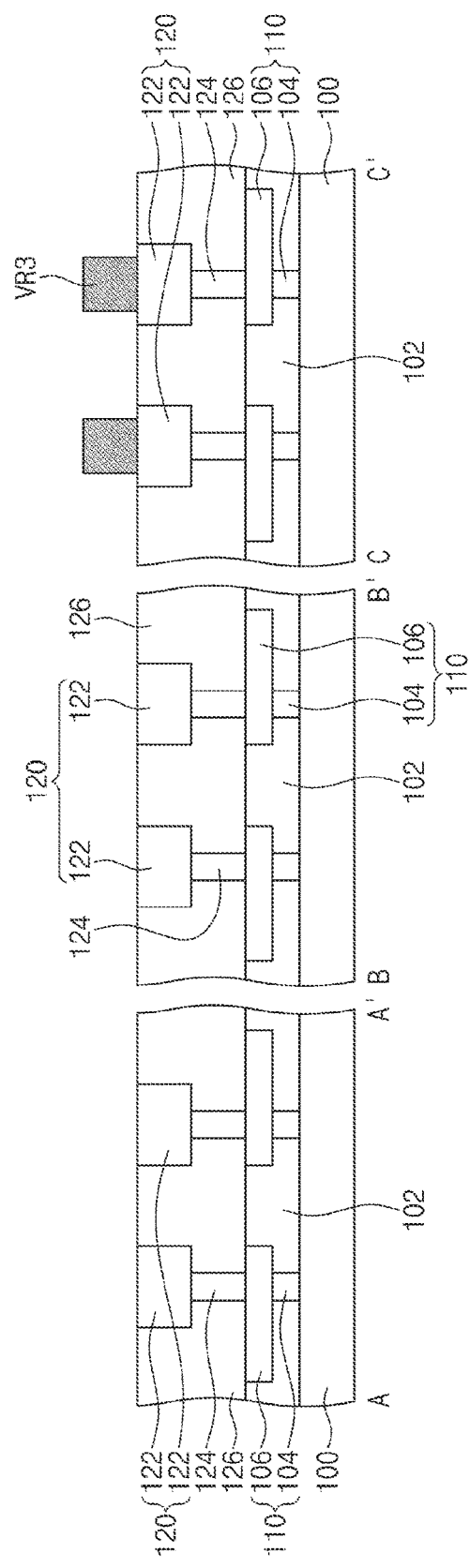
FIG. 10, FIG. 11, and FIG. 12 are sectional views, each of which is taken along lines A-A', B-B', and C-C' of FIG. 7 to describe a method of fabricating a variable resistance memory device, according to some example embodiments of the inventive concepts.
Figure 11:
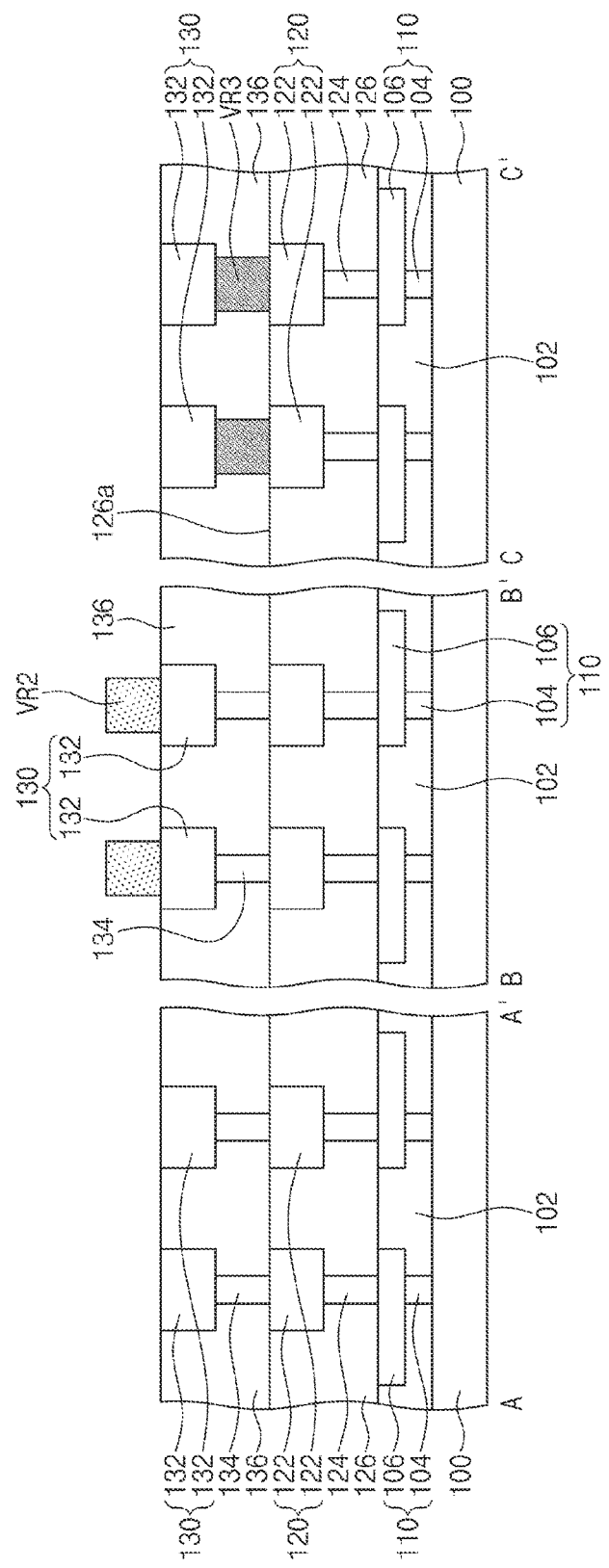
Figure 12:
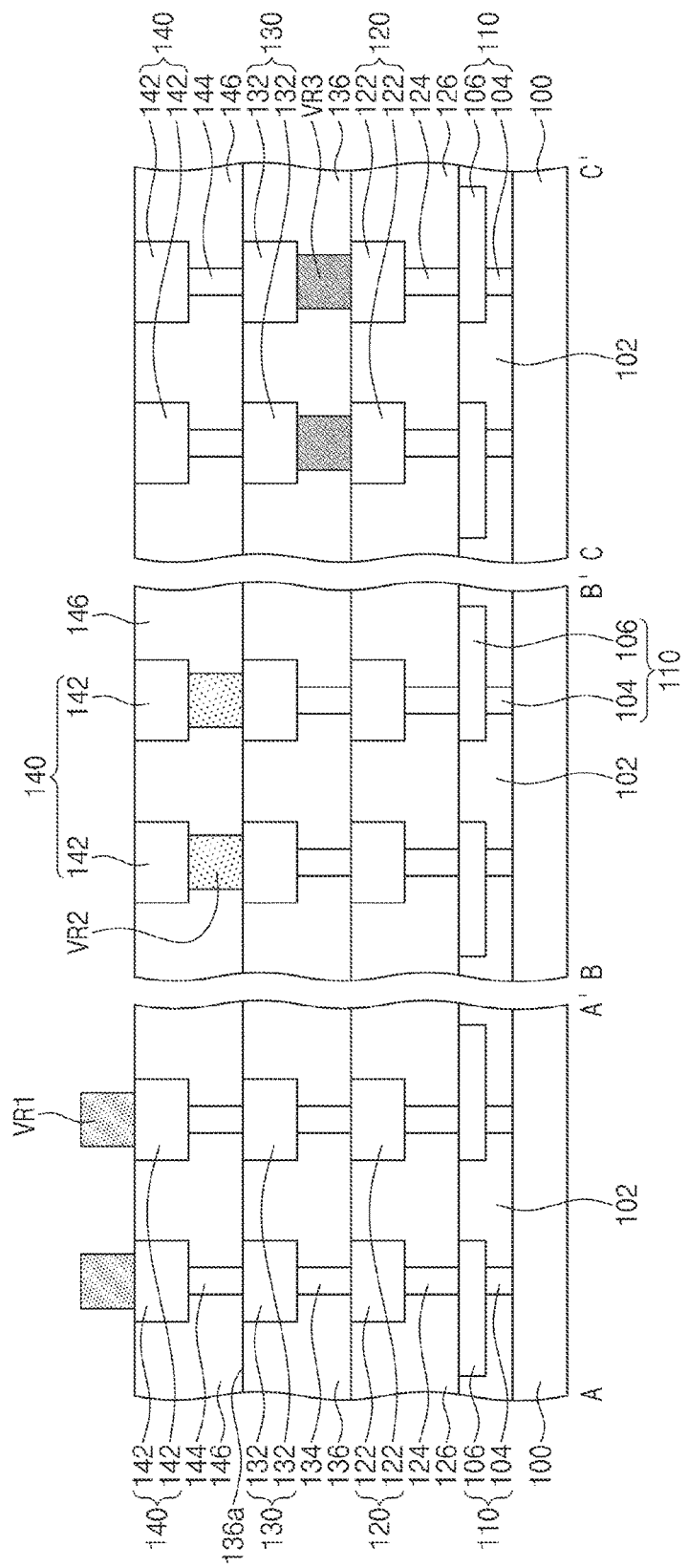

FIGS. 10 to 12 are sectional views, each of which is taken along lines A-A', B-B', and C-C' of FIG. 7 to describe a method of fabricating a variable resistance memory device, according to some example embodiments of the inventive concepts. In the following description, an element or step previously described with reference to FIGS. 5 and 6 may be identified by a similar or identical reference number without repeating an overlapping description thereof, for the sake of brevity.

Referring to FIGS. 7 and 10, the substrate 100 including the first memory region R1, the second memory region R2, and the third memory region R3 may be provided. The selection elements may be formed on the substrate 100, and the lower interlayered insulating layer 102 may be formed on the substrate 100 to cover the selection elements. The interconnection structure 110 may be formed in the lower interlayered insulating layer 102. The interconnection structure 110 may include the interconnection lines 106 spaced apart from the substrate 100 and the contacts 104 connected to the interconnection lines 106. The fourth interlayered insulating layer 126 may be formed on the lower interlayered insulating layer 102. The fourth interconnection patterns 122 and the fourth contact patterns 124 may be formed in the fourth interlayered insulating layer 126. The fourth contact patterns 124 may be formed on the first memory region R1, the second memory region R2, and the third memory region R3, respectively. Each of the fourth contact patterns 124 may be formed to electrically connect a corresponding one of the fourth interconnection patterns 122 to a corresponding one of the interconnection lines 106.

The third variable resistance pattern VR3 may be formed on the fourth interlayered insulating layer 126 and on the third memory region R3. In the case where the third variable resistance pattern VR3 includes the magnetic tunnel junction pattern described with reference to FIGS. 3A and 3B, the formation of the third variable resistance pattern VR3 may include sequentially forming a bottom electrode layer, a pinned layer, a tunnel barrier layer, a free layer, and a top electrode layer on the fourth interlayered insulating layer 126, and sequentially etching the top electrode layer, the free layer, the tunnel barrier layer, the pinned layer, and the bottom electrode layer to form the top electrode TE, the free pattern FRL, the tunnel barrier pattern TBR, the pinned pattern PNL, and the bottom electrode BE. The bottom electrode BE, the pinned pattern PNL, the tunnel barrier pattern TBR, the free pattern FRL, and the top electrode TE, which are provided on the third memory region R3 and are sequentially stacked on the fourth interlayered insulating layer 126, may constitute the third variable resistance pattern VR3. The resistance values r3 of the third variable resistance pattern VR3 may be determined by at least one of shapes, thicknesses, materials, or chemical structures of layers constituting of the third variable resistance pattern VR3.

Referring to FIGS. 7 and 11, the third interlayered insulating layer 136 may be formed on the fourth interlayered insulating layer 126. The third interlayered insulating layer 136 may be formed to cover a top surface 126a of the fourth interlayered insulating layer 126 on the first and second memory regions R1 and R2 and may be extend onto the third memory region R3 to cover the fourth interlayered insulating layer 126 and the third variable resistance pattern VR3. The third interconnection patterns 132 and the third contact patterns 134 may be formed in the third interlayered insulating layer 136. The third contact patterns 134 may be formed on the first and second memory regions R1 and R2, respectively. Each of the third contact patterns 134 may be formed to electrically connect a corresponding one of the third interconnection patterns 132 to a corresponding one of the fourth interconnection patterns 122. Each of the third variable resistance patterns VR3 may be connected to a corresponding one of the fourth interconnection patterns 122 and a corresponding one of the third interconnection patterns 132. The second variable resistance patterns VR2 may be formed on the second memory region R2 and the third interlayered insulating layer 136.

Referring to FIGS. 7 and 12, the second interlayered insulating layer 146 may be formed on the third interlayered insulating layer 136. The second interlayered insulating layer 146 may be formed to cover a top surface 136a of the third interlayered insulating layer 136 on the first and third memory regions R1 and R3 and may be extend onto the second memory region R2 to cover the third interlayered insulating layer 136 and the second variable resistance pattern VR2. The second interconnection patterns 142 and the second contact patterns 144 may be formed in the second interlayered insulating layer 146. The second contact patterns 144 may be formed on the first and third memory regions R1 and R3, respectively. Each of the second contact patterns 144 may electrically connect a corresponding one of the second interconnection patterns 142 to a corresponding one of the third interconnection patterns 132. The second variable resistance pattern VR2 may be connected to a corresponding one of the second interconnection patterns 142 and a corresponding one of the third interconnection patterns 132. The first variable resistance pattern VR1 may be formed on the first memory region R1 and on the second interlayered insulating layer 146.

Referring back to FIGS. 7 and 8, the first interlayered insulating layer 156 may be formed on the second interlayered insulating layer 146. The first interlayered insulating layer 156 may be provided on the second interlayered insulating layer 146 to cover the first variable resistance pattern VR1 on the first memory region R1 and may be extended to cover a top surface 146a of the second interlayered insulating layer 146 on the second and third memory regions R2 and R3. The first interconnection patterns 152 and the first contact patterns 154 may be formed in the first interlayered insulating layer 156. The first contact patterns 154 may be formed on the second and third memory regions R2 and R3, respectively. Each of the first contact patterns 154 may electrically connect a corresponding one of the first interconnection patterns 152 to a corresponding one of the second interconnection patterns 142. The first variable resistance pattern VR1 may be connected to a corresponding one of the first interconnection patterns 152 and a corresponding one of the second interconnection patterns 142.

Figure 13:
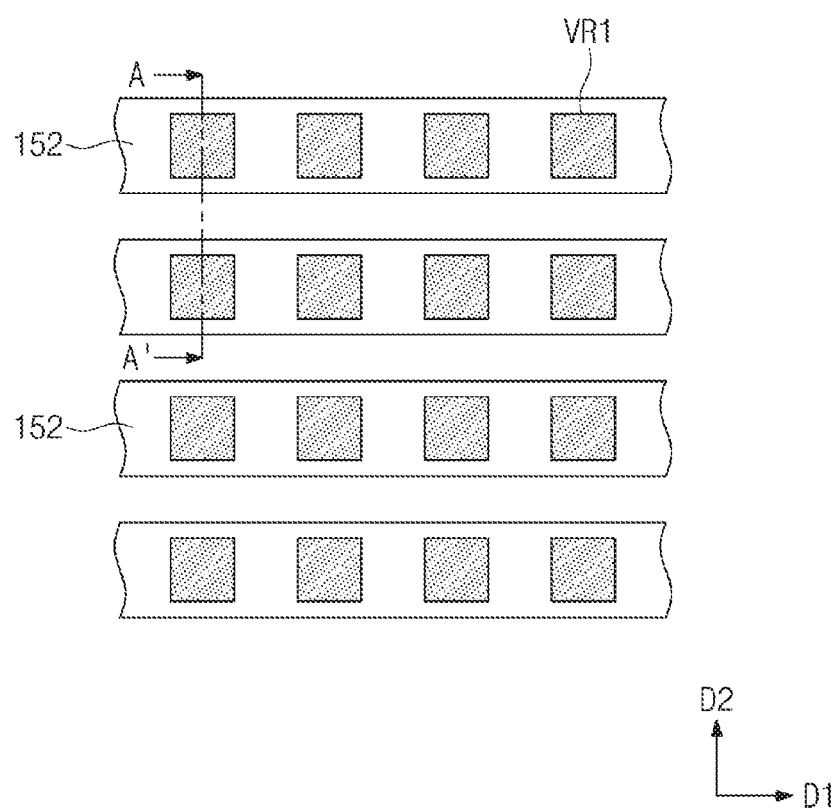
FIG. 13 is a plan view illustrating a variable resistance memory device according to some example embodiments of the inventive concepts.
Figure 14:
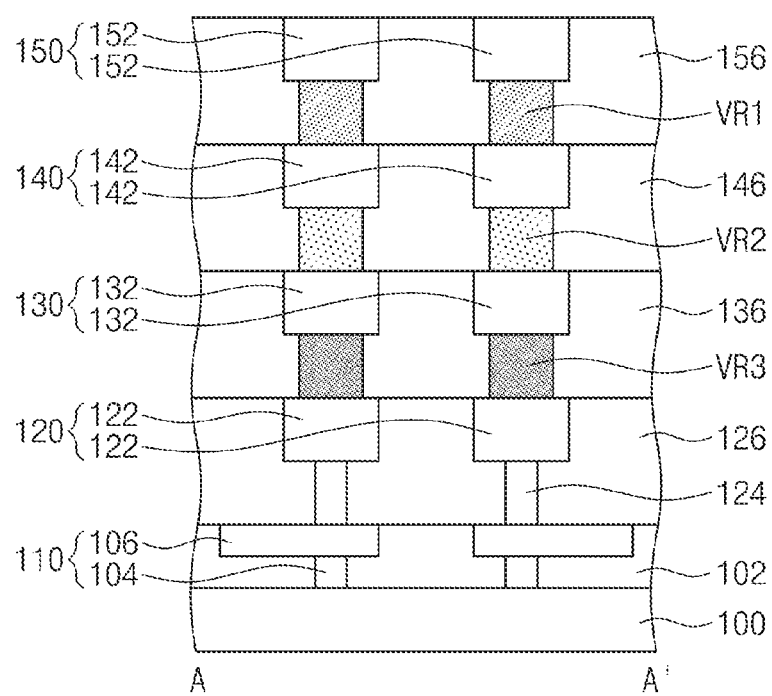
FIG. 14 is a sectional view taken along line A-A' of FIG. 13.
Figures 15, 16:
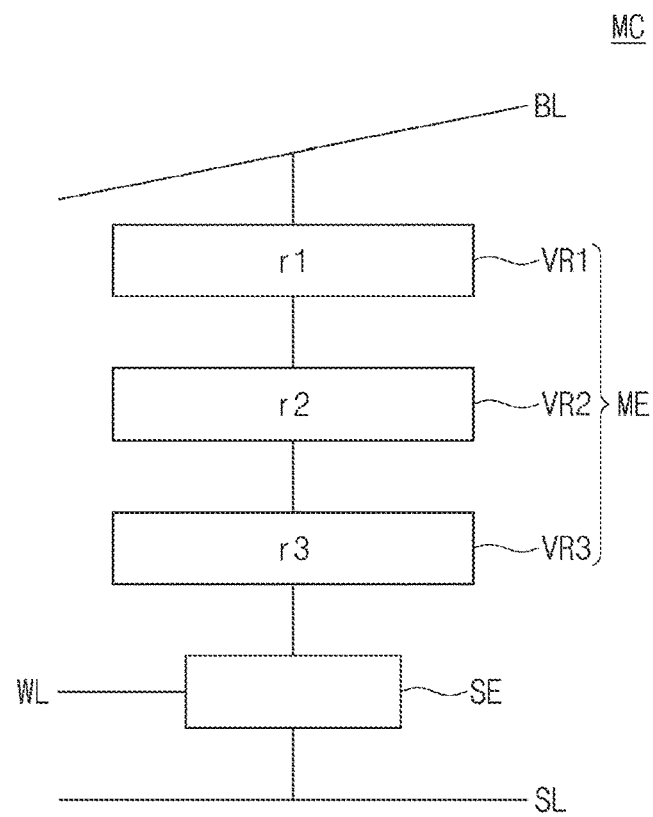
FIG. 15 is a circuit diagram illustrating a unit memory cell of a variable resistance memory device according to some example embodiments of the inventive concepts.
FIG. 16 is a table showing a plurality of resistance states, which may be realized by the unit memory cell of FIG. 15.

FIG. 13 is a plan view illustrating a variable resistance memory device according to some example embodiments of the inventive concepts, and FIG. 14 is a sectional view taken along line A-A' of FIG. 13. FIG. 15 is a circuit diagram illustrating a unit memory cell of a variable resistance memory device according to some example embodiments of the inventive concepts. FIG. 16 is a table showing a plurality of resistance states, which may be realized by the unit memory cell of FIG. 15. In the following description, an element previously described with reference to FIGS. 1, 2, 3A, 3B, 4A, and 4B may be identified by a similar or identical reference number without repeating an overlapping description thereof, for the sake of brevity.

Referring to FIGS. 13 and 14, the lower interlayered insulating layer 102 may be provided on the substrate 100 to cover the selection elements provided on the substrate 100.

The interconnection structure 110 including the interconnection lines 106 and the contacts 104 may be provided in the lower interlayered insulating layer 102. The first interlayered insulating layer 156, the second interlayered insulating layer 146, the third interlayered insulating layer 136, and the fourth interlayered insulating layer 126 may be stacked on the lower interlayered insulating layer 102.

The first interconnection group 150 including the first interconnection patterns 152 may be provided in the first interlayered insulating layer 156. When viewed in a plan view, the first interconnection patterns 152 may extend in the first direction D1 and may be spaced apart from each other in the second direction D2. The first variable resistance pattern VR1 may be provided in the first interlayered insulating layer 156. The first variable resistance pattern VR1 may be connected to a corresponding one of the first interconnection patterns 152. Restated, the first interconnection patterns 152 may be connected to an uppermost variable resistance pattern VR1 of the variable resistance patterns in a variable resistance memory device.

The second interconnection group 140 including the second interconnection patterns 142 may be provided in the second interlayered insulating layer 146. The second interconnection group 140 may be provided between the substrate 100 and the first interconnection group 150. The first variable resistance pattern VR1 may be provided between the first interconnection group 150 and the second interconnection group 140. When viewed in a plan view, the second interconnection patterns 142 may extend in a specific direction and may be spaced apart from each other in a direction crossing the specific direction. The first variable resistance pattern VR1 may be connected to a corresponding one of the second interconnection patterns 142. The second variable resistance pattern VR2 may be provided in the second interlayered insulating layer 146. The second variable resistance pattern VR2 may be connected to the corresponding second interconnection pattern 142 connected to the first variable resistance pattern VR1. The second variable resistance pattern VR2 may be connected in series to the first variable resistance pattern VR1 via the corresponding second interconnection pattern 142.

The third interconnection group 130 including the third interconnection patterns 132 may be provided in the third interlayered insulating layer 136. The third interconnection group 130 may be provided between the substrate 100 and the second interconnection group 140. The second variable resistance pattern VR2 may be provided between the second interconnection group 140 and the third interconnection group 130. When viewed in a plan view, the third interconnection patterns 132 may extend in a specific direction and may be spaced apart from each other in a direction crossing the specific direction. The second variable resistance pattern VR2 may be connected to a corresponding one of the third interconnection patterns 132. The third variable resistance pattern VR3 may be provided in the third interlayered insulating layer 136. The third variable resistance pattern VR3 may be connected to the corresponding third interconnection pattern 132 connected to the second variable resistance pattern VR2. The third variable resistance pattern VR3 may be connected in series to the second variable resistance pattern VR2 via the corresponding third interconnection pattern 132. In other words, the first to third variable resistance patterns VR1, VR2, and VR3 may be connected in series to each other.

The fourth interconnection group 120 including the fourth interconnection patterns 122 may be provided in the fourth interlayered insulating layer 126. The fourth interconnection group 120 may be provided between the substrate 100 and the third interconnection group 130. The third variable resistance pattern VR3 may be provided between the third interconnection group 130 and the fourth interconnection group 120. When viewed in a plan view, the fourth interconnection patterns 122 may extend in a specific direction and may be spaced apart from each other in a direction crossing the specific direction. The third variable resistance pattern VR3 may be connected to a corresponding one of the fourth interconnection patterns 122. The fourth contact pattern 124 may be provided in the fourth interlayered insulating layer 126, and the fourth contact pattern 124 may be connected to the corresponding fourth interconnection pattern 122 connected to the third variable resistance pattern VR3. The fourth contact pattern 124 may be electrically connected to a terminal of a corresponding one of the selection elements via a corresponding one of the interconnection lines 106 in the interconnection structure 110. Restated, a selection element may be connected to a lowermost variable resistance pattern VR3 of the variable resistance patterns in a variable resistance memory device.

A plurality of the first variable resistance patterns VR1 may be provided on the substrate 100. As an example, when viewed in a plan view, a plurality of the first variable resistance patterns VR1 may be arranged in the first and second directions D1 and D2. The first variable resistance patterns VR1 arranged in the first direction D1 may be connected in common to a corresponding one of the first interconnection patterns 152. The first variable resistance patterns VR1 arranged in the second direction D2 may be respectively connected to corresponding ones of the first interconnection patterns 152. A plurality of the second variable resistance patterns VR2 may be provided on the substrate 100. As an example, when viewed in a plan view, a plurality of the second variable resistance patterns VR2 may be arranged in both of the first and second directions D1 and D2. The plurality of the second variable resistance patterns VR2 may be connected in series to the plurality of the first variable resistance patterns VR1, respectively. A plurality of the third variable resistance patterns VR3 may be provided on the substrate 100. As an example, when viewed in a plan view, a plurality of the third variable resistance patterns VR3 may be arranged in both of the first and second directions D1 and D2. The plurality of the third variable resistance patterns VR3 may be connected in series to the plurality of the second variable resistance patterns VR2, respectively. Each of the third variable resistance patterns VR3 may be connected in series to a corresponding one of the first variable resistance patterns VR1 through a corresponding one of the second variable resistance patterns VR2. The plurality of the third variable resistance patterns VR3 may be respectively coupled to corresponding ones of the selection elements.

Referring to FIG. 15, the first to third variable resistance patterns VR1, VR2, and VR3 may be used as a part of a unit memory cell MC. The unit memory cell MC may include a memory element ME and a selection element SE. The memory element ME may be provided in series between the selection element SE and a bit line BL, and the selection element SE may be provided in series between the memory element ME and a word line WL. The selection element SE may be configured to selectively control a current flow of an electric current passing through the memory element ME. In the case where the selection element SE is a three-terminal switching device, such as bipolar transistors and MOSFETs, a source electrode of the selection element SE may be connected to a source line SL. A write voltage may be applied to the memory element ME through the bit line BL to write data to the memory element ME, and a read voltage may be applied to the memory element ME through the bit line BL to read out data from the memory element ME.

The first to third variable resistance patterns VR1, VR2, and VR3, which are connected in series to each other, may be used as a part of the memory element ME of the unit memory cell MC. At least one of shapes, thicknesses, materials, or chemical structures of layers constituting one of the first to third variable resistance patterns VR1, VR2, and VR3 may be different from that of layer constituting the others of the first to third variable resistance patterns VR1, VR2 and VR3. The resistances values r1, r2, and r3 of the first to third variable resistance patterns VR1, VR2, and VR3 may be different from each other. Restated, at least two variable resistance patterns may be associated with different resistance values. In some example embodiments, the resistance values r1 of the first variable resistance pattern VR1 (e.g., the resistance values with which the first variable resistance pattern VR1 is associated) may be lower than the resistance values r2 of the second variable resistance pattern VR2, and the resistance values r2 of the second variable resistance pattern VR2 may be lower than the resistance values r3 of the third variable resistance pattern VR3 (i.e., r1<r2<r3). A critical value of current, voltage, time, or the like, which is associated with a data switching operation of changing data, may be smaller for the first variable resistance pattern VR1 than for the second variable resistance pattern VR2, and may be smaller for the second variable resistance pattern VR2 than for the third variable resistance pattern VR3. In other words, the first variable resistance pattern VR1 may be more easily switched than the second variable resistance pattern VR2, and the second variable resistance pattern VR2 may be more easily switched than the third variable resistance pattern VR3.

Referring to FIGS. 15 and 16, various resistance states (e.g., Rs0, Rs1, Rs2, and Rs3) of the memory element ME of the unit memory cell MC may be realized depending on a resistance state of each of the first to third variable resistance patterns VR1, VR2, and VR3. In the case where each of the first to third variable resistance patterns VR1, VR2, and VR3 includes the magnetic tunnel junction pattern described with reference to FIGS. 3A and 3B, a resistance state of each of the first to third variable resistance patterns VR1, VR2, and VR3 may be dependent on whether the magnetization directions 160a and 160b of the pinned and free patterns PNL and FRL are parallel or antiparallel. In the case where the magnetization directions 160a and 160b of the pinned and free patterns PNL and FRL are parallel to each other, each of the first to third variable resistance patterns VR1, VR2, and VR3 may be in a low resistance state, and in the case where the magnetization directions 160a and 160b of the pinned and free patterns PNL and FRL are antiparallel to each other, each of the first to third variable resistance patterns VR1, VR2, and VR3 may be in a high resistance state. In the case where, as shown in FIG. 16, each of the first to third variable resistance patterns VR1, VR2, and VR3 is in a low resistance state (i.e., to have parallel magnetization directions 160a and 160b), the memory element ME may have a lowest resistance state Rs0. In the case where each of the first to third variable resistance patterns VR1, VR2, and VR3 is in a high resistance state (i.e., to have antiparallel magnetization directions 160a and 160b), the memory element ME may have a highest resistance state Rs3. The more the variable resistance patterns in the high resistance state, the higher the resistance of the memory element ME (i.e., Rs0<Rs1<Rs2<Rs3).

In the afore-described embodiments, since the first to third variable resistance patterns VR1, VR2, and VR3 are provided at different levels from the substrate 100, it may be possible to easily provide the first to third variable resistance patterns VR1, VR2, and VR3, whose switching characteristics are different from each other, on the single substrate 100. Furthermore, the first to third variable resistance patterns VR1, VR2, and VR3 may be vertically stacked on the substrate 100 and may be connected in series to each other, thereby serving as the memory element ME of the unit memory cell MC. Since the first to third variable resistance patterns VR1, VR2, and VR3 have different switching characteristics, it may be possible to realize various resistance states (e.g., Rs0, Rs1, Rs2, and Rs3) of the memory element ME. This may make it possible to increase a memory capacity of the memory element ME.

Figure 17:
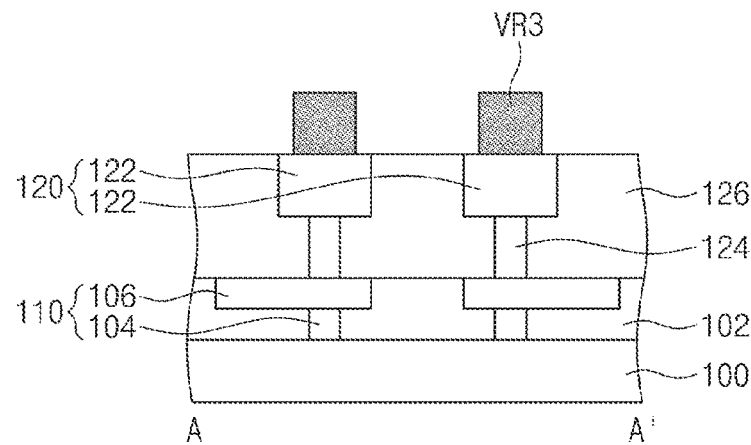
FIG. 17, FIG. 18, and FIG. 19 are sectional views, each of which is taken along line A-A' of FIG. 13 to describe a method of fabricating a variable resistance memory device according to some example embodiments of the inventive concepts.
Figure 18:
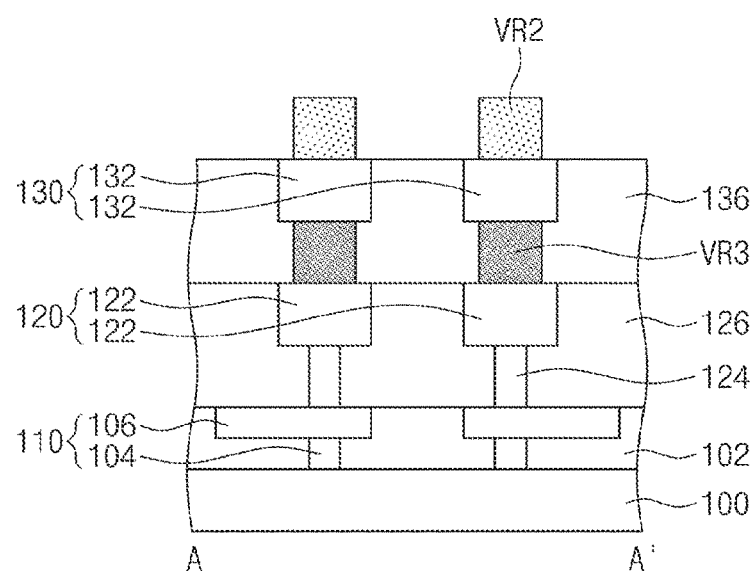
Figure 19:
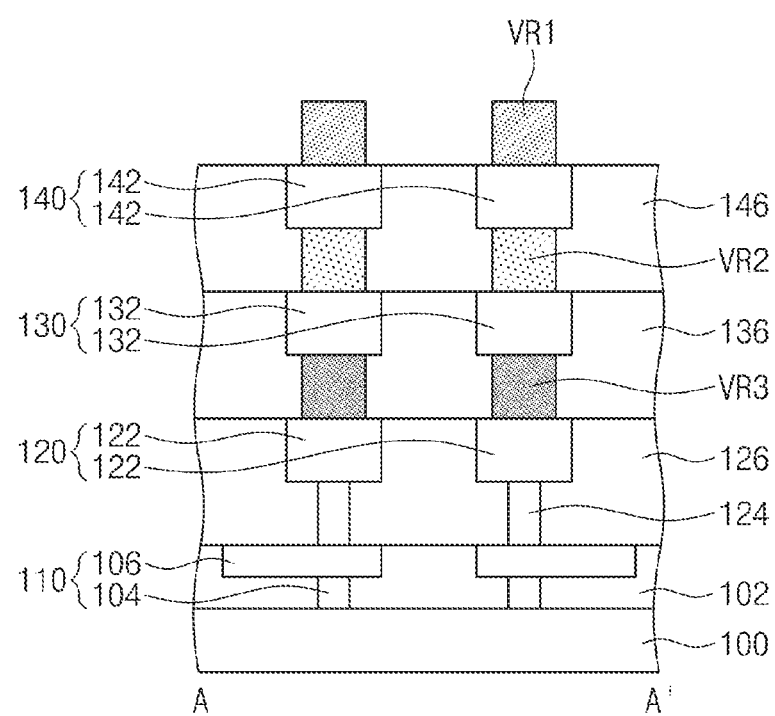

FIG. 17, FIG. 18, and FIG. 19 are sectional views, each of which is taken along line A-A' of FIG. 13 to describe a method of fabricating a variable resistance memory device according to some example embodiments of the inventive concepts. In the following description, an element or step previously described with reference to FIGS. 5 and 6 may be identified by a similar or identical reference number without repeating an overlapping description thereof, for the sake of brevity.

Referring to FIG. 17, the selection elements may be formed on the substrate 100, and the lower interlayered insulating layer 102 may be formed on the substrate 100 to cover the selection elements. The interconnection structure 110 including the interconnection lines 106 and the contacts 104 may be formed in the lower interlayered insulating layer 102. The fourth interconnection patterns 122 and the fourth contact pattern 124 may be formed in the fourth interlayered insulating layer 126. The fourth contact pattern 124 may be formed to electrically connect a corresponding one of the fourth interconnection patterns 122 to a corresponding one of the interconnection lines 106. The third variable resistance pattern VR3 may be formed on the fourth interlayered insulating layer 126. In the case where the third variable resistance pattern VR3 includes the magnetic tunnel junction pattern described with reference to FIGS. 3A and 3B, the formation of the third variable resistance pattern VR3 may include sequentially forming a bottom electrode layer, a pinned layer, a tunnel barrier layer, a free layer, and a top electrode layer on the fourth interlayered insulating layer 126, and sequentially etching the top electrode layer, the free layer, the tunnel barrier layer, the pinned layer, and the bottom electrode layer to form the top electrode TE, the free pattern FRL, the tunnel barrier pattern TBR, the pinned pattern PNL, and the bottom electrode BE. The resistance values r3 of the third variable resistance pattern VR3 may be determined by at least one of shapes, thicknesses, materials, or chemical structures of layers constituting of the third variable resistance pattern VR3.

Referring to FIG. 18, the third interlayered insulating layer 136 may be formed on the fourth interlayered insulating layer 126. The third interlayered insulating layer 136 may cover the third variable resistance pattern VR3. The third interconnection patterns 132 may be formed in the third interlayered insulating layer 136. Each of the third variable resistance patterns VR3 may be connected to a corresponding one of the fourth interconnection patterns 122 and a corresponding one of the third interconnection patterns 132. The second variable resistance pattern VR2 may be formed on the third interlayered insulating layer 136. In the case where the second variable resistance pattern VR2 includes the magnetic tunnel junction pattern described with reference to FIGS. 3A and 3B, a method of forming the second variable resistance pattern VR2 may be substantially the same as that for forming the third variable resistance pattern VR3, except that the second variable resistance pattern VR2 is formed on the third interlayered insulating layer 136. The resistance values r2 of the second variable resistance pattern VR2 may be determined by at least one of shapes, thicknesses, materials, or chemical structures of layers constituting of the second variable resistance pattern VR2.

Referring to FIG. 19, the second interlayered insulating layer 146 may be formed on the third interlayered insulating layer 136. The second interlayered insulating layer 146 may cover the second variable resistance pattern VR2. The second interconnection patterns 142 may be formed in the second interlayered insulating layer 146. The second variable resistance pattern VR2 may be connected to a corresponding one of the second interconnection patterns 142 and a corresponding one of the third interconnection patterns 132. The first variable resistance pattern VR1 may be formed on the second interlayered insulating layer 146. In the case where the first variable resistance pattern VR1 includes the magnetic tunnel junction pattern described with reference to FIGS. 3A and 3B, a method of forming the first variable resistance pattern VR1 may be substantially the same as that for the third variable resistance pattern VR3, except that the first variable resistance pattern VR1 is formed on the second interlayered insulating layer 146. The resistance values r1 of the first variable resistance pattern VR1 may be determined by at least one of shapes, thicknesses, materials, or chemical structures of layers constituting of the first variable resistance pattern VR1.

Referring back to FIG. 14, the first interlayered insulating layer 156 may be formed on the second interlayered insulating layer 146. The first interlayered insulating layer 156 may cover the first variable resistance pattern VR1. The first interconnection patterns 152 may be formed in the first interlayered insulating layer 156. The first variable resistance pattern VR1 may be connected to a corresponding one of the first interconnection patterns 152 and a corresponding one of the second interconnection patterns 142.

Figure 20:
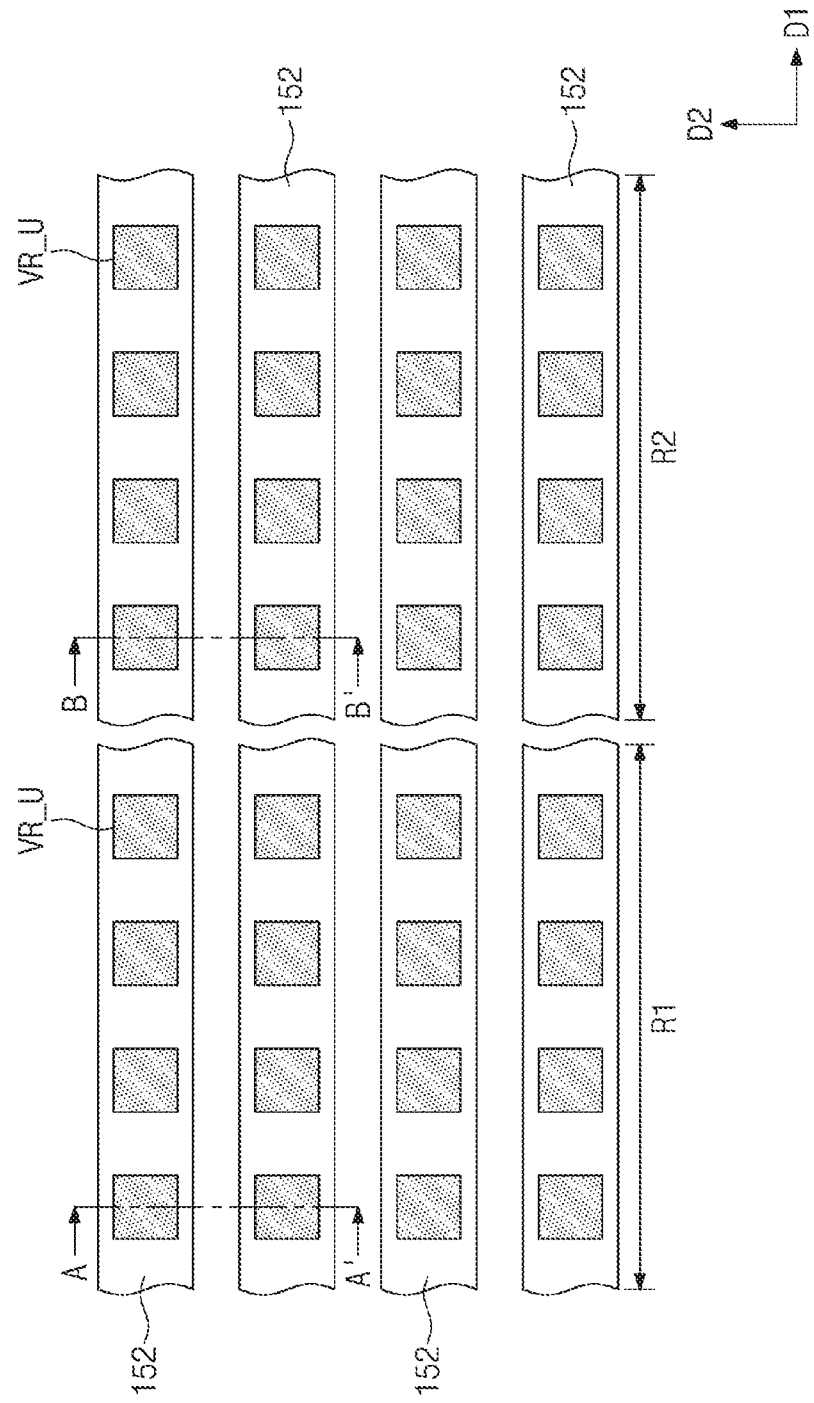
FIG. 20 is a plan view illustrating a variable resistance memory device according to some example embodiments of the inventive concepts.
Figure 21:
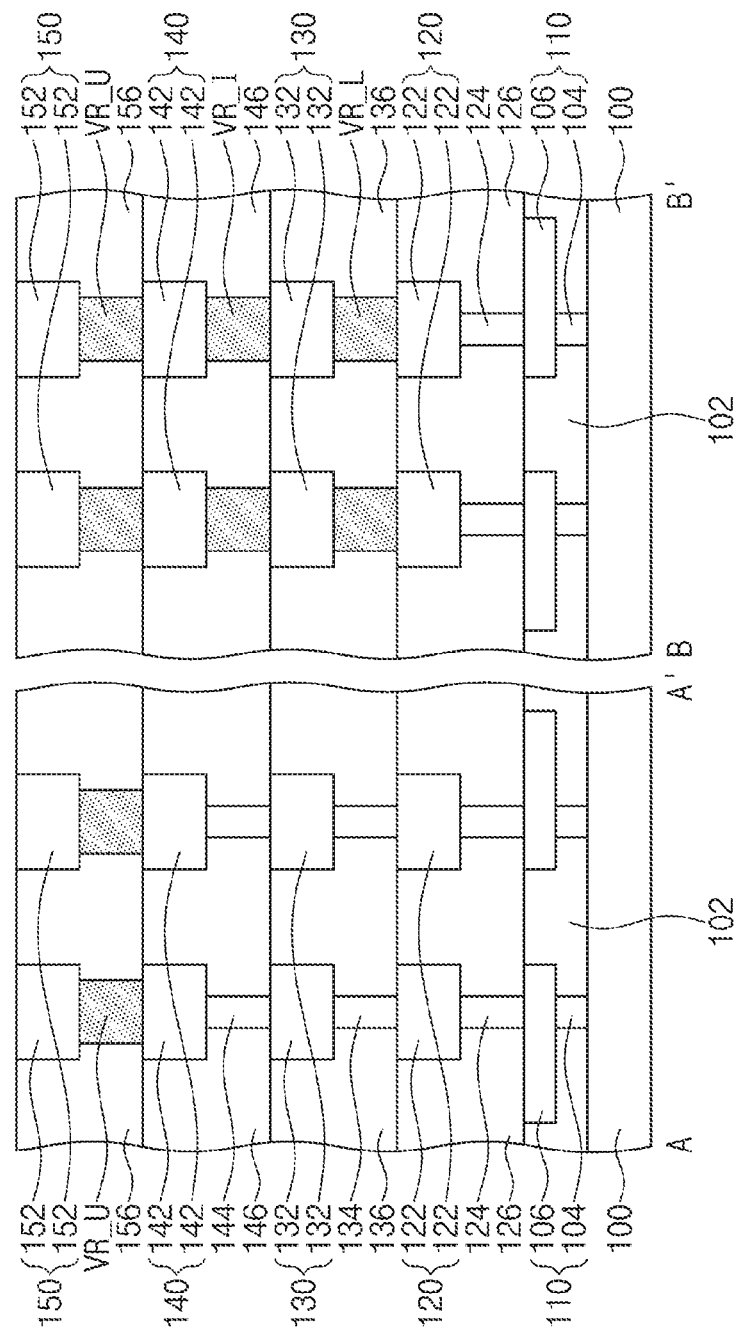
FIG. 21 is a sectional view taken along lines A-A' and B-B' of FIG. 20.
Figure 22A:
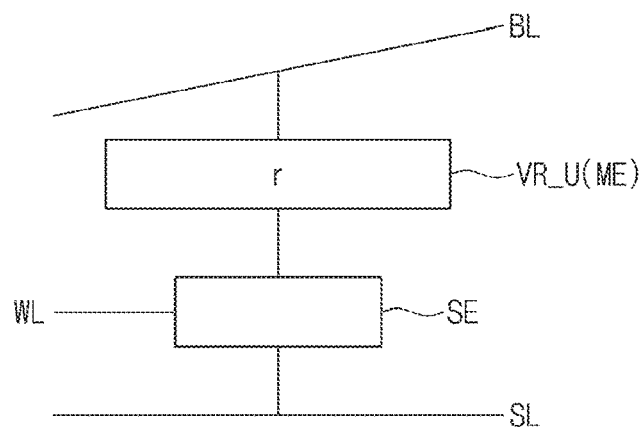
FIG. 22A and FIG. 22B are circuit diagrams illustrating unit memory cells, which are provided in first and second memory regions of a variable resistance memory device according to some example embodiments of the inventive concepts.
Figure 22B:
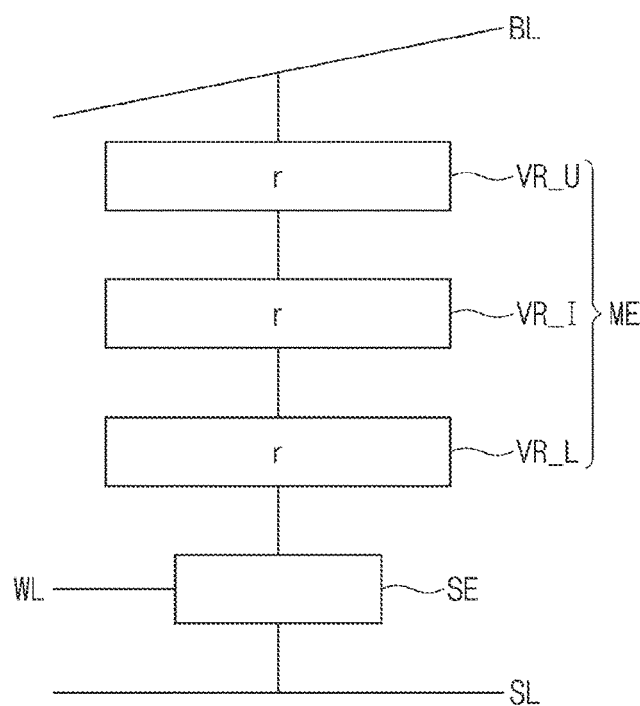

FIG. 20 is a plan view illustrating a variable resistance memory device according to some example embodiments of the inventive concepts, and FIG. 21 is a sectional view taken along lines A-A' and B-B' of FIG. 20. FIGS. 22A and 22B are circuit diagrams illustrating unit memory cells, which are provided in first and second memory regions of a variable resistance memory device according to some example embodiments of the inventive concepts. In the following description, an element previously described with reference to FIGS. 1, 2, 3A, 3B, 4A, and 4B may be identified by a similar or identical reference number without repeating an overlapping description thereof, for the sake of brevity.

Referring to FIGS. 20 and 21, the substrate 100 including the first and second memory regions R1 and R2 may be provided. The lower interlayered insulating layer 102 may be provided on the substrate 100 to cover the selection elements provided on the substrate 100. The interconnection structure 110 including the interconnection lines 106 and the contacts 104 may be provided in the lower interlayered insulating layer 102. The first interlayered insulating layer 156, the second interlayered insulating layer 146, the third interlayered insulating layer 136, and the fourth interlayered insulating layer 126 may be stacked on the lower interlayered insulating layer 102.

The first interconnection group 150 including the first interconnection patterns 152 may be provided in the first interlayered insulating layer 156. When viewed in a plan view, the first interconnection patterns 152 on the first memory region R1 may extend in a first direction D1 and may be spaced apart from each other in a second direction D2 crossing the first direction D1. When viewed in a plan view, the first interconnection patterns 152 on the second memory region R2 may extend in the first direction D1 and may be spaced apart from each other in the second direction D2, but the inventive concepts are not limited thereto. Upper variable resistance patterns VR_U may be provided in the first interlayered insulating layer 156. The upper variable resistance patterns VR_U may be provided on the first and second memory regions R1 and R2, respectively. The upper variable resistance patterns VR_U may be respectively connected to corresponding ones of the first interconnection patterns 152. The upper variable resistance pattern VR_U in the first memory region R1 may be referred to as an additional variable resistance pattern in relation to the plurality of variable resistance patterns in the second memory region R2. The interconnection pattern 152 on the upper variable resistance pattern VR_U in the first memory region R1 may be referred to as an additional interconnection pattern.

The second interconnection group 140 including the second interconnection patterns 142 may be provided in the second interlayered insulating layer 146. The second interconnection group 140 may be provided between the substrate 100 and the first interconnection group 150, and the upper variable resistance patterns VR_U may be provided between the first interconnection group 150 and the second interconnection group 140. When viewed in a plan view, the second interconnection patterns 142 may extend in a specific direction and may be spaced apart from each other in a direction crossing the specific direction. The upper variable resistance patterns VR_U may be respectively connected to corresponding ones of the second interconnection patterns 142. The second contact pattern 144 may be provided on the first memory region R1 and in the second interlayered insulating layer 146. The second contact pattern 144 may be connected to the corresponding second interconnection pattern 142, which is provided on the first memory region R1 and is connected to the upper variable resistance pattern VR_U. An intermediate variable resistance pattern VR_I may be provided in the second interlayered insulating layer 146 on the second memory region R2. The intermediate variable resistance pattern VR_I may be connected to the corresponding second interconnection pattern 142, which is provided on the second memory region R2 and is connected to the upper variable resistance pattern VR_U. The intermediate variable resistance pattern VR_I may be connected in series to the upper variable resistance pattern VR_U on the second memory region R2.

The third interconnection group 130 including the third interconnection patterns 132 may be provided in the third interlayered insulating layer 136. The third interconnection group 130 may be provided between the substrate 100 and the second interconnection group 140, and the second contact pattern 144 and the intermediate variable resistance pattern VR_I may be provided between the second interconnection group 140 and the third interconnection group 130. When viewed in a plan view, the third interconnection patterns 132 may extend in a specific direction and may be spaced apart from each other in a direction crossing the specific direction. The second contact pattern 144 and the intermediate variable resistance pattern VR_I may be respectively connected to corresponding ones of the third interconnection patterns 132. The third contact pattern 134 may be provided in the third interlayered insulating layer 136 on the first memory region R1. The third contact pattern 134 may be connected to the corresponding third interconnection pattern 132, which is connected to the second contact pattern 144. A lower variable resistance pattern VR_L may be provided in the third interlayered insulating layer 136 and on the second memory region R2. The lower variable resistance pattern VR_L may be connected to the corresponding third interconnection pattern 132, which is provided on the second memory region R2 and is connected to the intermediate variable resistance pattern VR_I. The lower variable resistance pattern VR_L may be connected in series to the upper variable resistance pattern VR_U and the intermediate variable resistance pattern VR_I, on the second memory region R2.

The fourth interconnection group 120 including the fourth interconnection patterns 122 may be provided in the fourth interlayered insulating layer 126. The fourth interconnection group 120 may be provided between the substrate 100 and the third interconnection group 130, and the third contact pattern 134 and the lower variable resistance pattern VR_L may be provided between the third interconnection group 130 and the fourth interconnection group 120. When viewed in a plan view, the fourth interconnection patterns 122 may extend in a specific direction and may be spaced apart from each other in a direction crossing the specific direction. The third contact pattern 134 and the lower variable resistance pattern VR_L may be respectively connected to corresponding ones of the fourth interconnection patterns 122. The fourth contact patterns 124 may be provided in the fourth interlayered insulating layer 126. The fourth contact patterns 124 may be provided on the first and second memory regions R1 and R2, respectively. One of the fourth contact patterns 124 may be connected to the corresponding fourth interconnection pattern 122, which is connected to the third contact pattern 134, and another of the fourth contact patterns 124 may be connected to the corresponding fourth interconnection pattern 122, which is connected to the lower variable resistance pattern VR_L. The fourth contact patterns 124 may be connected to respective ones of the interconnection lines 106 in the interconnection structure 110.

The upper variable resistance pattern VR_U on the first memory region R1 may be coupled to a terminal of a corresponding one of the selection elements provided on the substrate 100, where such a corresponding one of the selection elements may be referred to herein as an additional selection element. For example, the upper variable resistance pattern VR_U on the first memory region R1 may be connected to a corresponding one of the interconnection lines 106 in the interconnection structure 110 through the second interconnection pattern 142, the second contact pattern 144, the third interconnection pattern 132, the third contact pattern 134, the fourth interconnection pattern 122, and the fourth contact pattern 124, which are electrically connected thereto, and may be coupled to the corresponding selection element through the corresponding interconnection line 106. By applying a voltage to the upper variable resistance pattern VR_U on the first memory region R1 through the first interconnection pattern 152, it may be possible to control the upper variable resistance pattern VR_U on the first memory region R1.

The upper, intermediate, and lower variable resistance patterns VR_U, VR_I, and VR_L, which are provided on the second memory region R2 and are connected in series to each other, may be coupled to a terminal of a corresponding one of the selection elements provided on the substrate 100. For example, the upper, intermediate, and lower variable resistance patterns VR_U, VR_I, and VR_L on the second memory region R2 may be connected in series to each other. The lower variable resistance pattern VR_L may be connected to a corresponding one of the interconnection lines 106 in the interconnection structure 110 through the fourth interconnection pattern 122 and the fourth contact pattern 124, which are electrically connected thereto, and may be coupled to the corresponding selection element through the corresponding interconnection line 106. By applying a voltage to the first interconnection pattern 152, which is provided on the second memory region R2 and is connected to the upper variable resistance pattern VR_U, it may be possible to control the upper, intermediate, and lower variable resistance patterns VR_U, VR_I, and VR_L, which are provided on the second memory region R2 and are connected in series to each other.

Referring to FIGS. 22A and 22B, the upper variable resistance pattern VR_U on the first memory region R1 may be used as a part of a first memory cell MC1 on the first memory region R1. The upper, intermediate, and lower variable resistance patterns VR_U, VR_I, and VR_L, which are provided on the second memory region R2 and are connected in series to each other, may be used as a part of a second memory cell MC2 on the second memory region R2. Each of the first and second memory cells MC1 and MC2 may include a memory element ME and a selection element SE. The memory element ME may be provided in series between the selection element SE and a bit line BL, and the selection element SE may be provided in series between the memory element ME and a word line WL. The selection element SE may be configured to selectively control a current flow of an electric current passing through the memory element ME. In the case where the selection element SE is a three-terminal switching device, such as bipolar transistors and MOSFETs, a source electrode of the selection element SE may be connected to a source line SL. A write voltage may be applied to the memory element ME through the bit line BL to write data to the memory element ME, and a read voltage may be applied to the memory element ME through the bit line BL to read out data from the memory element ME.

The upper variable resistance pattern VR_U on the first memory region R1 may serve as the memory element ME of the first memory cell MC1, and the upper, intermediate, and lower variable resistance patterns VR_U, VR_I, and VR_L, which are provided on the second memory region R2 and are connected in series to each other, may serve as the memory element ME of the second memory cell MC2. According to some example embodiments, the upper, intermediate, and lower variable resistance patterns VR_U, VR_I, and VR_L may include substantially the same layers in terms of their shapes, thicknesses, materials, or chemical structures. The upper variable resistance pattern VR_U may be configured to have substantially the same resistance values r (e.g., common resistance values) as each of the intermediate and lower variable resistance patterns VR_I, and VR_L. In this case, the memory element ME of the first memory cell MC1 may have substantially the same resistance state as a resistance state of the upper variable resistance pattern VR_U on the first memory region R1, and a resistance state of the memory element ME of the second memory cell MC2 may be substantially equal to the sum of the resistance states of the upper, intermediate, and lower variable resistance patterns VR_U, VR_I, and VR_L on the second memory region R2.

According to some example embodiments of the inventive concepts, a single variable resistance pattern (i.e., the upper variable resistance pattern VR_U) may be provided on the first memory region R1, whereas a plurality of variable resistance patterns (i.e., the upper, intermediate, and lower variable resistance patterns VR_U, VR_I, and VR_L), which are connected in series to each other, may be vertically stacked on the second memory region R2. The variable resistance pattern on the first memory region R1 may be provided at substantially the same height as one of the plurality of variable resistance patterns on the second memory region R2, when measured from the substrate 100. The variable resistance pattern on the first memory region R1 may be associated with a common resistance value as at least one variable resistance pattern of the plurality of variable resistance patterns on the second memory region R2. The variable resistance pattern on the first memory region R1 may serve as the memory element ME of the first memory cell MC1, and the plurality of variable resistance patterns on the second memory region R2 may serve as the memory element ME of the second memory cell MC2. In this case, the memory elements ME of the first and second memory cells MC1 and MC2 may be configured to have different resistance states. Accordingly, it may be possible to provide a variable resistance memory device including the first and second memory cells MC1 and MC2 with different resistance levels.

Figure 23:
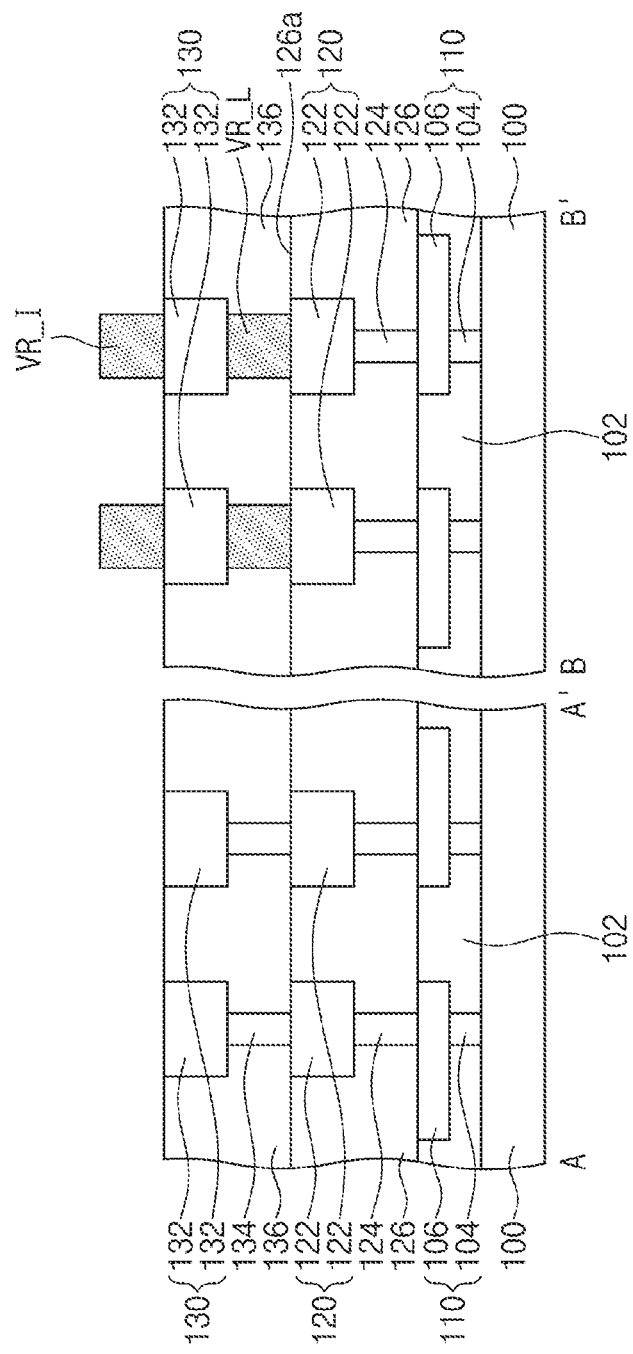
FIG. 23 is a sectional view, which is taken along lines A-A' and B-B' of FIG. 20 to describe a method of fabricating a variable resistance memory device according to some example embodiments of the inventive concepts.

FIG. 23 is a sectional view, which is taken along lines A-A' and B-B' of FIG. 20 to describe a method of fabricating a variable resistance memory device according to some example embodiments of the inventive concepts. In the following description, an element or step previously described with reference to FIGS. 5 and 6 may be identified by a similar or identical reference number without repeating an overlapping description thereof, for the sake of brevity.

Referring to FIGS. 20 and 23, the selection elements may be formed on the substrate 100, and the lower interlayered insulating layer 102 may be formed on the substrate 100 to cover the selection elements. The interconnection structure 110 including the interconnection lines 106 and the contacts 104 may be formed in the lower interlayered insulating layer 102. The fourth interconnection patterns 122 and the fourth contact patterns 124 may be formed in the fourth interlayered insulating layer 126. Each of the fourth contact patterns 124 may be formed to electrically connect a corresponding one of the fourth interconnection patterns 122 to a corresponding one of the interconnection lines 106. The lower variable resistance pattern VR_L may be formed on the second memory region R2 and on the fourth interlayered insulating layer 126. The third interlayered insulating layer 136 may be formed on the fourth interlayered insulating layer 126. The third interlayered insulating layer 136 may cover a top surface 126a of the fourth interlayered insulating layer 126 on the first memory region R1 and may be extended onto the second memory region R2 to cover the fourth interlayered insulating layer 126 and the lower variable resistance pattern VR_L. The third interconnection patterns 132 and the third contact pattern 134 may be formed in the third interlayered insulating layer 136. The third interconnection patterns 132 may be formed at substantially the same height from the substrate 100 to constitute the third interconnection group 130. The third contact pattern 134 may be formed between the fourth interlayered insulating layer 126 on the first memory region R1 and the third interconnection group 130. The third contact pattern 134 may connect a corresponding one of the fourth interconnection patterns 122 electrically with a corresponding one of the third interconnection patterns 132. The lower variable resistance pattern VR_L may be connected to a corresponding one of the fourth interconnection patterns 122 and a corresponding one of the third interconnection patterns 132. The intermediate variable resistance pattern VR_I may be formed on the second memory region R2 and on the third interlayered insulating layer 136.

Referring back to FIGS. 20 and 21, the second interlayered insulating layer 146 may be formed on the third interlayered insulating layer 136. The second interlayered insulating layer 146 may cover a top surface of the third interlayered insulating layer 136 on the first memory region R1 and may be extended onto the second memory region R2 to cover the third interlayered insulating layer 136 and the intermediate variable resistance pattern VR_I. The second interconnection patterns 142 and the second contact pattern 144 may be formed in the second interlayered insulating layer 146. The second interconnection patterns 142 may be formed at substantially the same height from the substrate 100 to constitute the second interconnection group 140. The second contact pattern 144 may be formed between the third interlayered insulating layer 136 on the first memory region R1 and the second interconnection group 140. The second contact pattern 144 may be formed to electrically connect a corresponding one of the third interconnection patterns 132 to a corresponding one of the second interconnection patterns 142. The intermediate variable resistance pattern VR_I may be connected to a corresponding one of the third interconnection patterns 132 and a corresponding one of the second interconnection patterns 142.

The upper variable resistance patterns VR_U may be formed on the second interlayered insulating layer 146. The upper variable resistance patterns VR_U may be formed on the first and second memory regions R1 and R2, respectively. The first interlayered insulating layer 156 may be formed on the second interlayered insulating layer 146. The first interlayered insulating layer 156 may be provided on the second interlayered insulating layer 146 to cover the upper variable resistance patterns VR_U. The first interconnection patterns 152 may be formed in the first interlayered insulating layer 156. The first interconnection patterns 152 may be formed at substantially the same height from the substrate 100 to constitute the first interconnection group 150. Each of the upper variable resistance patterns VR_U may be connected to a corresponding one of the first interconnection patterns 152 and a corresponding one of the second interconnection patterns 142.

According to some example embodiments of the inventive concepts, a variable resistance device may include variable resistance patterns, which are located at different heights from a substrate. This may make it possible to easily realize a difference in switching characteristics between the variable resistance patterns. Accordingly, the variable resistance patterns with different switching characteristics can be easily provided on a single substrate. In addition, the variable resistance device may include memory cells including the variable resistance patterns. Since the variable resistance patterns are located at different heights from the substrate, it may be possible to easily provide the memory cells, whose resistance levels are different from each other, on a single substrate.

While example embodiments of the inventive concepts have been particularly shown and described, it will be understood by one of ordinary skill in the art that variations in form and detail may be made therein without departing from the spirit and scope of the attached claims.

What is claimed is:

1. A device, comprising:
a substrate including a first memory region and a second memory region;
a first variable resistance pattern on the first memory region at a first height from the substrate, the first variable resistance pattern including
a first shape,
a first thickness, and
a first material; and
a second variable resistance pattern on the second memory region at a second height from the substrate, the second height less than the first height from the substrate, the second variable resistance pattern including
a second shape that is different from the first shape,
a second thickness that is different from the first thickness,
a second material that is different from the first material,
a sub-combination thereof, or
a combination thereof;
a first interconnection group on the substrate, the first interconnection group including a plurality of first interconnection patterns;
a second interconnection group between the substrate and the first interconnection group, the second interconnection group including a plurality of second interconnection patterns; and
a third interconnection group between the substrate and the second interconnection group, the third interconnection group including a plurality of third interconnection patterns,
wherein the first interconnection group, the second interconnection group, and the third interconnection group are at different heights from the substrate,
wherein the first variable resistance pattern is between the first interconnection group and the second interconnection group, and
wherein the second variable resistance pattern is between the second interconnection group and the third interconnection group.

2. The device of claim 1, wherein,
the first variable resistance pattern is connected to one first interconnection pattern of the plurality of first interconnection patterns and one second interconnection pattern of the plurality of second interconnection patterns, and
the second variable resistance pattern is connected to a separate one second interconnection pattern of the plurality of second interconnection patterns and one third interconnection pattern of the plurality of third interconnection patterns.

3. The device of claim 2, further comprising:
a first contact pattern on the second memory region, the first contact pattern between the first interconnection group and the second interconnection group; and
a second contact pattern on the first memory region, the second contact pattern between the second interconnection group and the third interconnection group,
wherein the first variable resistance pattern is connected to a separate one third interconnection pattern of the plurality of third interconnection patterns via the second contact pattern, and wherein the second variable resistance pattern is connected to a separate one first interconnection pattern of the plurality of first interconnection patterns via the first contact pattern.

4. The device of claim 3, wherein,
the first variable resistance pattern is electrically coupled to the substrate through the second contact pattern and the separate one third interconnection pattern of the plurality of third interconnection patterns connected to the second contact pattern, and
the second variable resistance pattern is electrically coupled to the substrate through the one third interconnection pattern of the plurality of third interconnection patterns connected to the second variable resistance pattern.

5. The device of claim 4, wherein,
the first variable resistance pattern is configured to be controlled based on application of a voltage through the one first interconnection pattern of the plurality of first interconnection patterns connected thereto,
the second variable resistance pattern is configured to be controlled based on application of a separate voltage through the first contact pattern and the separate one first interconnection pattern of the plurality of first interconnection patterns connected to the first contact pattern, and
the first variable resistance pattern and the second variable resistance pattern are configured to be independently controlled.

6. The device of claim 1, wherein,
the first variable resistance pattern and the second variable resistance pattern include a first magnetic tunnel junction pattern and a second magnetic tunnel junction pattern, respectively,
the first magnetic tunnel junction pattern is configured to switch magnetization direction based on a first critical current density, and
the second magnetic tunnel junction pattern is configured to switch magnetization direction based on a second critical current density, the second critical current density different from the first critical current density.

7. The device of claim 1, wherein the first variable resistance pattern and the second variable resistance pattern are laterally spaced apart from each other on the substrate.

8. The device of claim 1, wherein,
the first variable resistance pattern is included in a first memory cell on the first memory region, the first memory cell being a non-volatile memory (NVM) cell, and
the second variable resistance pattern included in a second memory cell on the second memory region, the second memory cell being a random access memory (RAM) cell.

9. A device, comprising:
a substrate including a first memory region and a second memory region;
a first variable resistance pattern on the first memory region at a first height from the substrate; and
a second variable resistance pattern on the second memory region at a second height from the substrate, the second height different from than the first height, the second variable resistance pattern including an intrinsic property that is different from a corresponding intrinsic property of the first variable resistance pattern;
a first interconnection group on the substrate, the first interconnection group including a plurality of first interconnection patterns;
a second interconnection group between the substrate and the first interconnection group, the second interconnection group including a plurality of second interconnection patterns; and
a third interconnection group between the substrate and the second interconnection group, the third interconnection group including a plurality of third interconnection patterns,
wherein the first interconnection group, the second interconnection group, and the third interconnection group are at different heights from the substrate,
wherein the first variable resistance pattern is between the first interconnection group and the second interconnection group, and
wherein the second variable resistance pattern is between the second interconnection group and the third interconnection group.

10. The device of claim 9, wherein,
the first variable resistance pattern is connected to one first interconnection pattern of the plurality of first interconnection patterns and one second interconnection pattern of the plurality of second interconnection patterns, and
the second variable resistance pattern is connected to a separate one second interconnection pattern of the plurality of second interconnection patterns and one third interconnection pattern of the plurality of third interconnection patterns.

11. The device of claim 10, further comprising:
a first contact pattern on the second memory region, the first contact pattern between the first interconnection group and the second interconnection group; and
a second contact pattern on the first memory region, the second contact pattern between the second interconnection group and the third interconnection group,
wherein the first variable resistance pattern is connected to a separate one third interconnection pattern of the plurality of third interconnection patterns via the second contact pattern, and
wherein the second variable resistance pattern is connected to a separate one first interconnection pattern of the plurality of first interconnection patterns via the first contact pattern.

12. The device of claim 11, wherein,
the first variable resistance pattern is electrically coupled to the substrate through the second contact pattern and the separate one third interconnection pattern of the plurality of third interconnection patterns connected to the second contact pattern, and
the second variable resistance pattern is electrically coupled to the substrate through the one third interconnection pattern of the plurality of third interconnection patterns connected to the second variable resistance pattern.

* * * * *